(12) United States Patent
Ando et al.

(10) Patent No.: US 9,947,511 B2
(45) Date of Patent: Apr. 17, 2018

(54) ANTENNA FOR PLASMA GENERATION AND PLASMA PROCESSING DEVICE HAVING THE SAME

(71) Applicant: NISSIN ELECTRIC CO., LTD., Kyoto (JP)

(72) Inventors: Yasunori Ando, Kyoto (JP); Dongwei Li, Kyoto (JP)

(73) Assignee: NISSIN ELECTRIC CO., LTD., Kyoto (JP)

( * ) Notice: Subject to any disclaimer, the term of this patent is extended or adjusted under 35 U.S.C. 154(b) by 67 days.

(21) Appl. No.: 14/872,144

(22) Filed: Oct. 1, 2015

(65) Prior Publication Data
US 2016/0099130 A1 Apr. 7, 2016

(30) Foreign Application Priority Data

Oct. 1, 2014 (JP) .................................. 2014-202880
Apr. 17, 2015 (JP) .................................. 2015-084769
Jun. 4, 2015 (JP) .................................. 2015-113934

(51) Int. Cl.
*H01J 37/32* (2006.01)

(52) U.S. Cl.
CPC ..... *H01J 37/3211* (2013.01); *H01J 37/32522* (2013.01)

(58) Field of Classification Search
None
See application file for complete search history.

(56) References Cited

U.S. PATENT DOCUMENTS

| 5,397,962 A * | 3/1995 | Moslehi | H05H 1/46 315/111.51 |
| 6,042,700 A * | 3/2000 | Gopalraja | C23C 14/046 204/192.12 |

(Continued)

FOREIGN PATENT DOCUMENTS

| JP | H11-317299 | 11/1999 |
| JP | 2002-510841 | 4/2002 |

(Continued)

OTHER PUBLICATIONS

"Office Action of Korea Counterpart Application" with English translation thereof, dated Dec. 12, 2016, p. 1-p. 5.

(Continued)

*Primary Examiner* — Douglas W Owens
*Assistant Examiner* — Srinivas Sathiraju
(74) *Attorney, Agent, or Firm* — JCIPRNET

(57) ABSTRACT

Provided are an antenna, which is disposed in a vacuum chamber for generating an inductively coupled plasma, and a plasma processing device. The antenna and the plasma processing device suppress increase of the impedance even if the antenna is lengthened. An antenna 20 is disposed in a vacuum chamber 2 for generating an inductively coupled plasma 16 in the vacuum chamber 2 by applying a high frequency current. The antenna 20 includes an insulating pipe 22 and a hollow antenna body 24 which is disposed in the insulating pipe 22 and in which cooling water flows. The antenna body 24 has a structure that a plurality of metal pipes 26 are connected in series with a hollow insulator 28 interposed between the adjacent metal pipes 26, and each connecting portion has a sealing function with respect to vacuum and the cooling water.

19 Claims, 16 Drawing Sheets

(56) References Cited

U.S. PATENT DOCUMENTS

| | | | | |
|---|---|---|---|---|
| 6,092,485 | A * | 7/2000 | Ando | H01L 21/67213 118/723 FI |
| 6,132,566 | A * | 10/2000 | Hofmann | C23C 14/358 118/723 AN |
| 6,254,746 | B1 * | 7/2001 | Subramani | H01J 37/321 118/715 |
| 6,368,469 | B1 * | 4/2002 | Nulman | H01J 37/3402 204/192.12 |
| 6,494,998 | B1 * | 12/2002 | Brcka | H01J 37/321 118/723 I |
| 6,514,390 | B1 * | 2/2003 | Xu | H01J 37/3405 204/192.12 |
| 6,893,907 | B2 * | 5/2005 | Maydan | H01J 37/321 438/149 |
| 7,183,514 | B2 * | 2/2007 | Kamarehi | H01J 37/32192 118/723 MW |
| 7,190,119 | B2 * | 3/2007 | Patrick | H01J 37/3299 118/723 I |
| 7,255,774 | B2 * | 8/2007 | Vukovic | H01J 37/321 118/723 AN |
| 9,048,518 | B2 * | 6/2015 | Kudela | H01J 37/32577 |
| 9,273,393 | B2 * | 3/2016 | Glukhoy | C23C 16/453 |
| 9,305,749 | B2 * | 4/2016 | Ye | H01J 37/3211 |
| 9,412,579 | B2 * | 8/2016 | Sadjadi | H01L 21/02104 |
| 2013/0221833 | A1 * | 8/2013 | Kudela | H01J 37/32577 313/231.31 |
| 2015/0053553 | A1 * | 2/2015 | Ando | H01J 37/32119 204/298.03 |
| 2015/0155141 | A1 * | 6/2015 | Kobayashi | H01J 37/32513 156/345.29 |
| 2015/0228456 | A1 * | 8/2015 | Ye | H01J 37/3211 315/111.51 |
| 2016/0155617 | A1 * | 6/2016 | Kusumoto | H01L 21/67103 156/345.27 |
| 2016/0329256 | A1 * | 11/2016 | Sadjadi | H01L 21/02104 |

FOREIGN PATENT DOCUMENTS

| | | |
|---|---|---|
| JP | 2012-133899 | 7/2012 |
| JP | 2013206652 | 10/2013 |
| TW | I324027 | 4/2010 |
| TW | 201212728 | 3/2012 |
| WO | 2011041087 | 4/2011 |

OTHER PUBLICATIONS

"Office Action of Taiwan Counterpart Application" with English translation, dated Jul. 1, 2016, p. 1-p. 16.

"Office Action of China Counterpart Application," with English translation, dated Jun. 2, 2017, p. 1-p. 5.

* cited by examiner

ANTENNA FOR PLASMA GENERATION AND PLASMA PROCESSING DEVICE HAVING THE SAME

CROSS REFERENCE TO RELATED APPLICATIONS

This application claims the priority benefit of Japan applications serial no. 2014-202880, filed on Oct. 1, 2014, Japan applications serial no. 2015-113934, filed on Jun. 4, 2015, and Japan applications serial no. 2015-084769, filed on Apr. 17, 2015. The entirety of each of the above-mentioned patent applications is hereby incorporated by reference herein and made a part of this specification.

BACKGROUND OF THE INVENTION

Field of the Invention

The invention relates to an antenna to be applied with a high frequency current for generating an inductively coupled plasma in a vacuum chamber, and a plasma processing device that generates an induced electric field in the vacuum chamber by applying a high frequency current to the antenna disposed in the vacuum chamber to generate an inductively coupled plasma and process a substrate with the plasma. In this application, ions refer to positive ions. The processing applied on the substrate, for example, includes forming a film by a plasma CVD (chemical vapor deposition) process, etching, ashing, sputtering, or the like.

Description of Related Art

The conventional technology has proposed an antenna for generating an inductively coupled plasma (abbreviated as ICP) in a vacuum chamber by an induced electric field that is generated by applying a high frequency current to the antenna, and a plasma processing device including the antenna.

In this type of plasma processing device, the impedance of the antenna increases as the antenna is lengthened to cope with a large-size substrate. Consequently, a large potential difference occurs between two ends of the antenna. Under the influence of the large potential difference, plasma uniformity, such as the plasma density distribution, potential distribution, and electron temperature distribution, deteriorates and results in poor uniformity of the substrate processing. Moreover, as the impedance of the antenna increases, it also becomes difficult for the high frequency current to flow to the antenna.

Several plasma processing devices having the configuration of the antenna and the condenser being connected in series have been proposed in order to solve these issues.

For example, Patent Literature 1 (Japanese Patent Publication No. 2002-510841) proposes a plasma processing device that has an external antenna (i.e. an antenna disposed outside the vacuum chamber; the same hereinafter). In this device, a plurality of linear conductors that constitute a loop-shaped antenna are arranged side by side in the upper portion (external) of a dielectric window which forms a part of the vacuum chamber, and the condenser is connected in series to a return conductor of the loop-shaped antenna, which is far away from the dielectric window.

Patent Literature 2 (Japanese Patent Publication No. H11-317299) discloses a plasma processing device that has an internal antenna (i.e. an antenna disposed in the vacuum chamber; the same hereinafter). In this device, a plurality of linear antennas passing through an antenna conductor in an insulating pipe are arranged side by side in the vacuum chamber and the antennas are connected in series by the condenser disposed outside the vacuum chamber.

Patent Literature 3 (Japanese Patent Publication No. 2012-133899) discloses a plasma processing device having an internal antenna. In this device, a planar antenna (planar conductor) has one main surface located in the vacuum chamber, and one or more grooves that extend in a direction intersecting the flowing direction of the high frequency current are formed on the main surface to divide the main surface into a plurality of regions. In each groove, a condenser is disposed, such that each region of the planar antenna and each condenser are electrically connected in series.

SUMMARY OF THE INVENTION

Problem to be Solved

According to the technique disclosed in Patent Literature 1, because the antenna conductor and the condenser are connected in series, the potential difference between two ends of the entire loop-shaped antenna due to inversion of the potential can be reduced. However, since the conductor that is directly involved in plasma generation and close to the dielectric window is a linear conductor, as the linear conductor is lengthened to cope with the size increase of the substrate, the impedance of each linear conductor increases accordingly. As a result, the potential difference that occurs between two ends of each linear conductor close to the dielectric window increases and causes the plasma uniformity to drop. In addition, due to the increase of the impedance of each linear conductor, it becomes difficult for the high frequency current to flow and the inductive coupling state may not be achieved efficiently.

Moreover, because it is an external antenna and the inductive coupling proceeds through the dielectric window, the distance to the plasma space is long due to the thickness of the dielectric window material and the plasma generation efficiency is low compared to the case of an internal antenna.

According to the technique disclosed in Patent Literature 2, as each antenna is lengthened to cope with the size increase of the substrate, the impedance of each antenna increases accordingly. As a result, the potential difference that occurs between two ends of each antenna increases and causes the plasma uniformity to drop. In addition, due to the increase of the impedance of each antenna, it becomes difficult for the high frequency current to flow and the inductive coupling state may not be achieved efficiently.

According to the technique disclosed in Patent Literature 3, because it is an internal antenna, the plasma generation efficiency is high compared to the case of an external antenna, and the condenser is respectively disposed in one or more grooves formed on the main surface of the planar antenna on the inner side of the vacuum chamber. Thus, it has the feature that the potential difference between two ends of the planar antenna can be suppressed even if the planar antenna is lengthened to cope with the size increase of the substrate. However, the planar antenna may easily hold a two-dimensional direction potential distribution in the plane and causes a corresponding plasma distribution to be easily transferred to the film on the substrate surface. From the aspect of improving this problem, a pipe-shaped antenna conductor is preferred. In the case of a pipe-shaped antenna conductor, however, the technique of disposing the condenser in the groove of the planar antenna as disclosed in Patent Literature 3 is not applicable. A new design around the condenser is therefore required.

Because the technique disclosed in Patent Literature 3 is an internal antenna, the plasma generation efficiency is high compared to the case of an external antenna, and the condenser is respectively disposed in one or more grooves formed on the main surface of the planar antenna on the inner side of the vacuum chamber. Thus, it has the feature that the potential difference between two ends of the planar antenna can be suppressed even if the planar antenna is lengthened to cope with the size increase of the substrate. However, the planar antenna may easily hold a two-dimensional direction potential distribution in the plane and causes a corresponding plasma distribution to be easily transferred to the film on the substrate surface, compared to a pipe-shaped antenna.

Therefore, the invention provides an antenna that is disposed in a vacuum chamber for generating an inductively coupled plasma. The antenna uses a metal pipe in the antenna conductor and can suppress increase of the impedance of the antenna even if the antenna is lengthened. The invention further provides a plasma processing device that generates an inductively coupled plasma in a vacuum chamber by applying a high frequency current to the antenna disposed in the vacuum chamber. The plasma processing device uses a metal pipe in the antenna conductor and can suppress increase of the impedance of the antenna even if the antenna is lengthened.

Solution to the Problem

An antenna according to the invention is disposed in a vacuum chamber and is applied with a high frequency current for generating an inductively coupled plasma in the vacuum chamber. The antenna includes an insulating pipe and a hollow antenna body, which is disposed in the insulating pipe and in which cooling water flows. The antenna body has a structure that (a) a plurality of metal pipes are connected in series with a hollow insulator interposed between the adjacent metal pipes, and each connecting portion of the metal pipes and the hollow insulator has a waterproof and air-proof seal (e.g. has a sealing function with respect to vacuum and the cooling water).

The antenna includes (b) a condenser that is electrically connected in series to the metal pipes on two sides of the hollow insulator, and the hollow insulator and the condenser are disposed in the vacuum chamber, wherein the connecting portion that connects one end of the hollow insulator with the metal pipe is called a first connecting portion, and the connecting portion that connects the other end with the metal pipe is called a second connecting portion. Regarding the condenser, (a) a portion of the metal pipe on the side of the first connecting portion also serves as a first electrode of the condenser, and the condenser includes (b) a dielectric disposed in a region from an outer peripheral portion of the metal pipe on the side of the first connecting portion to an outer peripheral portion of the hollow insulator and (c) a second electrode disposed in a region from an outer peripheral portion of the dielectric to an outer peripheral portion of the metal pipe on the side of the second connecting portion and electrically connected to the metal pipe on the side of the second connecting portion, wherein the second electrode has a region that overlaps the metal pipe on the side of the first connecting portion with the dielectric interposed therebetween.

The antenna includes (b) a layered condenser disposed on the outer peripheral portion of each hollow insulator and has a structure that the metal pipes on two sides of each hollow insulator and the condenser are electrically connected in series. Each condenser includes (a) a first electrode disposed on the outer peripheral portion of the hollow insulator and electrically connected to the metal pipe that is connected to one side of the hollow insulator; (b) a second electrode disposed on the outer peripheral portion of the hollow insulator to overlap the first electrode and electrically connected to the metal pipe that is connected to the other side of the hollow insulator; and (c) a dielectric disposed between the first electrode and the second electrode.

A plasma processing device according to the invention generates an induced electric field in a vacuum chamber by applying a high frequency current to an antenna disposed in the vacuum chamber to generate an inductively coupled plasma and processes a substrate by using the plasma. The antenna includes an insulating pipe and a hollow antenna body, which is disposed in the insulating pipe and in which cooling water flows. The antenna body has a structure that (a) a plurality of metal pipes are connected in series with a hollow insulator interposed between the adjacent metal pipes, and the connecting portion has a sealing function with respect to vacuum and the cooling water.

The plasma processing device includes (b) a condenser disposed in a portion of the hollow insulator and has a structure that the metal pipes on two sides of the hollow insulator and the condenser are electrically connected in series. The hollow insulator and the condenser are disposed in the vacuum chamber. Moreover, the plasma processing device further includes a high frequency power source connected to a power supply end, which is one end of the antenna body, and supplying the high frequency current to the antenna body, and a terminal end, which is the other end of the antenna body, is grounded via a coil.

BRIEF DESCRIPTION OF THE DRAWINGS

DESCRIPTION OF THE EMBODIMENTS (1) FIG. 1, an embodiment of the antenna, etc., illustrates an example of the plasma processing device that includes the antenna of an embodiment of the invention. FIG. 2 is an enlarged view showing an example of the area around a condenser of the antenna of FIG. 1.

Figure 1:
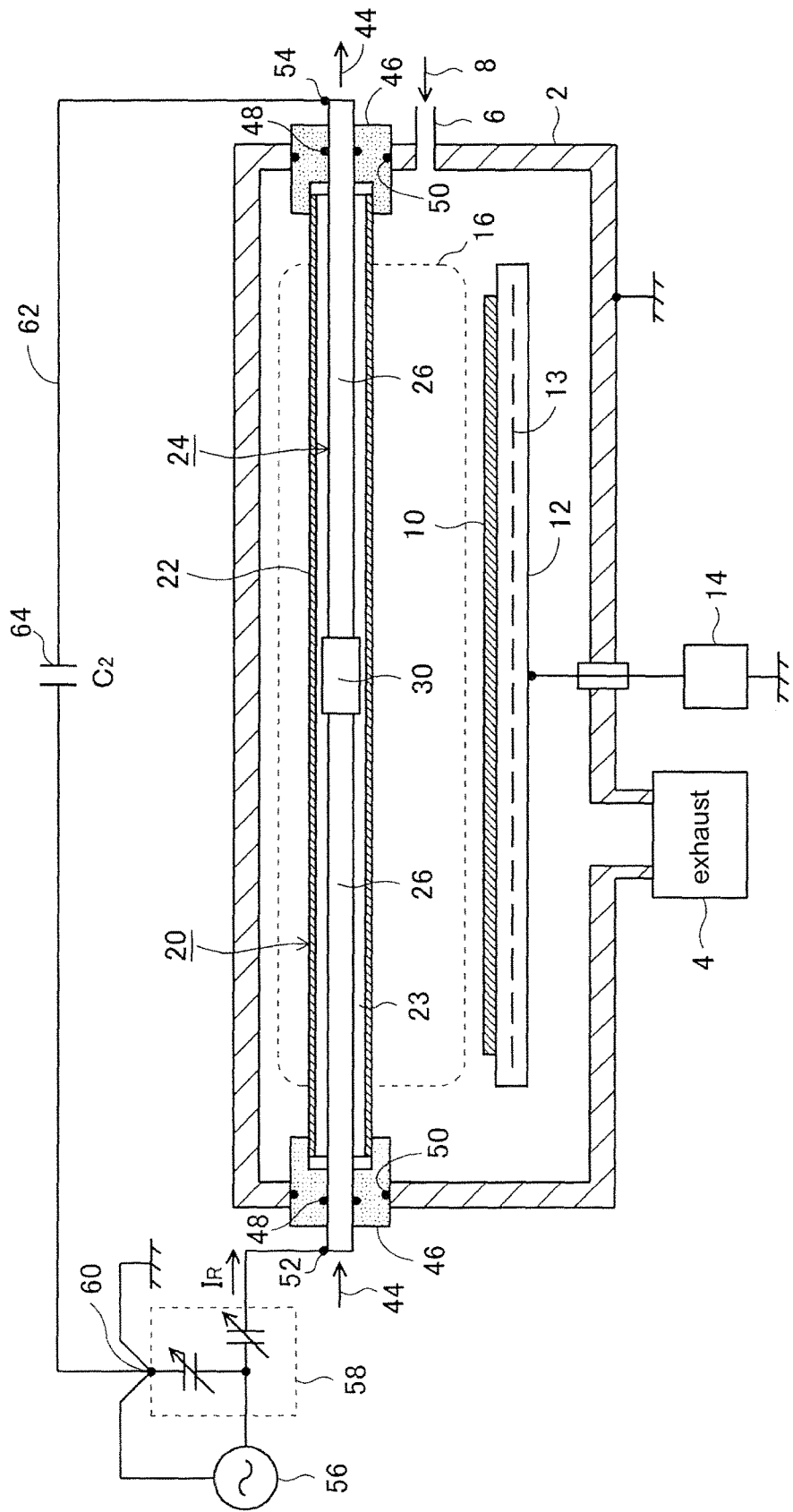
FIG. 1 is a schematic longitudinal sectional view showing an example of the plasma processing device that includes the antenna according to an embodiment of the invention.

The plasma processing device includes a vacuum chamber 2, which is evacuated and into which a gas 8 is introduced; an antenna 20, which is disposed in the vacuum chamber 2 and to which a high frequency current $I_R$ is applied to generate an inductively coupled plasma 16 in the vacuum chamber 2; and a high frequency power source 56, which applies the high frequency current $I_R$ to the antenna 20. The plasma processing device is configured to process a substrate 10 by using the generated plasma 16.

The substrate 10 is a substrate for flat panel displays (FPD) such as liquid crystal displays and organic EL displays, or a flexible substrate for flexible displays, for example, but not limited to the foregoing.

The processing applied on the substrate 10, for example, includes forming a film by a plasma CVD (chemical vapor deposition) process, etching, ashing, sputtering, or the like.

The plasma processing device is also called a plasma CVD device when used for film formation by plasma CVD, a plasma etching device when used for etching, a plasma ashing device when used for ashing, and a plasma sputtering device when used for sputtering.

The vacuum chamber 2 is a metallic container, for example, and the interior of the vacuum chamber 2 is evacuated by an evacuation device 4. In this example, the vacuum chamber 2 is electrically grounded.

The gas 8 is introduced into the vacuum chamber 2 through a flow controller (not shown) and a gas introduction pipe 6, for example. The gas 8 may be any gas corresponding to the content of the processing on the substrate 10. For example, if the film formation is performed on the substrate 10 by a plasma CVD method, the gas 8 is a gas obtained by diluting a source gas with a diluent gas (e.g. $H_2$). More specifically, if the source gas is $SiH_4$, a Si film can be formed on the surface of the substrate 10, and a SiN film and a $SiO_2$ film can be formed respectively on the surface of the substrate 10 when the source gas is $SiH_4+NH_3$ and $SiH_4+O_2$.

In the vacuum chamber 2, a substrate holder 12 is disposed for holding the substrate 10. As in this example, a bias voltage may be applied from a bias power source 14 to the substrate holder 12. The bias voltage is a negative DC voltage or a negative pulse voltage, for example, but not limited thereto. By applying such a bias voltage, for example, the energy when the positive ions in the plasma 16 enter the substrate 10 can be controlled to control the crystallinity of the film formed on the surface of the substrate 10. As in this example, a heater 13 for heating the substrate 10 may be disposed in the substrate holder 12.

In this example, the antenna 20 is a linear antenna and is disposed along the surface of the substrate 10 (substantially in parallel to the surface of the substrate 10, for example) near the upper portion in the vacuum chamber 2. One or a plurality of the antennas 20 may be disposed in the vacuum chamber 2. An example of disposing a plurality of the antennas 20 is described below with reference to FIG. 11.

The antenna 20 includes an insulating pipe 22 and a hollow antenna body 24, which is disposed in the insulating pipe 22 and in which cooling water 44 flows. In this example, the antenna body 24 is disposed in the insulating pipe 22 with a space 23 therebetween. The reason will be explained later.

The material of the insulating pipe 22 includes quartz, alumina, fluororesin, silicon nitride, silicon carbide, and silicon, for example, but not limited to the foregoing.

The reason for disposing the insulating pipe 22 is explained below. That is, as known, in a structure where the conductor and high frequency plasma are close, electrons are lighter than the ions in the plasma and much more electrons enter the conductor. Thus, the plasma potential rises to the positive side with respect to the conductor. In contrast thereto, with the aforementioned insulating pipe 22 disposed, the insulating pipe 22 can suppress the charged particles in the plasma 16 from entering the metal pipes 26 that form the antenna body 24. Therefore, rise of the plasma potential due to entry of the charged particles (mainly electrons) into the metal pipes 26 can be suppressed and metal contamination of the plasma 16 and the substrate 10, which results from that the metal pipes 26 are sputtered by the charged particles (mainly ions), can be suppressed as well.

Figure 4:
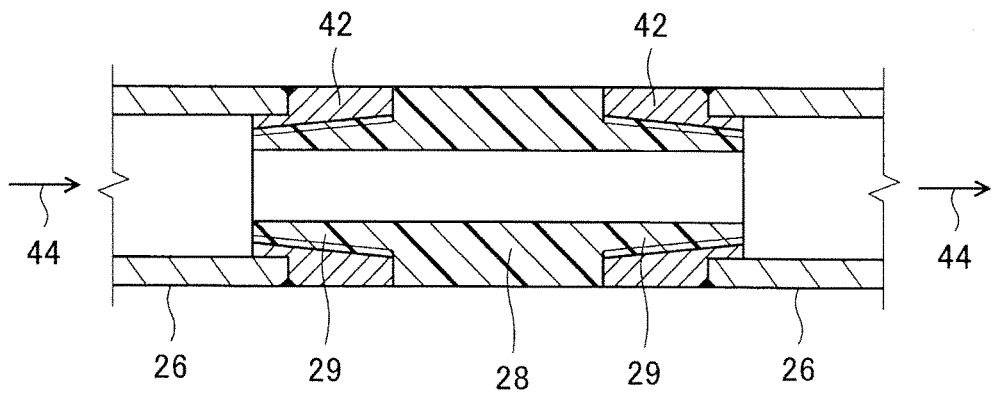
FIG. 4 is a schematic enlarged sectional view showing another example of the area around the hollow insulator of the antenna.

The antenna body 24 has a structure that a plurality of metal pipes 26 are connected in series with a hollow insulator 28 interposed between the adjacent metal pipes 26. Each connecting portion has a sealing function with respect to vacuum and the cooling water 44. The sealing function may be achieved by a conventional sealing means. For example, packing may be used, or a tapered thread structure for pipe, as shown in FIG. 4, may be used. Details regarding this are explained below.

In this example, the number of the metal pipes 26 is two and accordingly the number of the hollow insulators 28 (and the condenser 30 disposed on the outer peripheral portion thereof) is one. Nevertheless, the number of the metal pipes 26 may be three or more, and in any case, the number of the hollow insulators 28 (and the condenser 30 disposed on the outer peripheral portion thereof) is one less than the number of the metal pipes 26.

The antenna body 24 includes a layered condenser 30 disposed on the outer peripheral portion of each hollow insulator 28 and has a structure that the metal pipes 26 on the left and right sides of each hollow insulator 28 and the condenser 30 are electrically connected in series (see the equivalent circuit of FIG. 5). Thus, the hollow insulator 28 and the condenser 30 are disposed in the vacuum chamber 2, as shown in FIG. 1.

Figure 2:
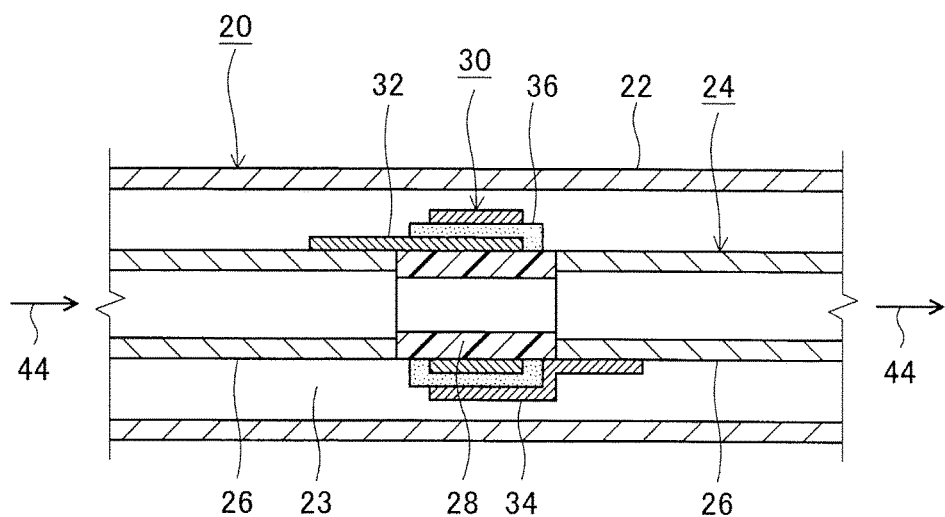
FIG. 2 is a schematic enlarged sectional view showing an example of the area around the condenser of the antenna in FIG. 1.

Referring mainly to FIG. 2, each condenser 30 includes (a) a first electrode 32, (b) a second electrode 34, and (c) a dielectric 36. The first electrode 32 is an electrode disposed on the outer peripheral portion of the hollow insulator 28 and is electrically connected to the metal pipe 26 that is connected to one side of the hollow insulator 28. The second electrode 34 is an electrode disposed to overlap the first electrode on the outer peripheral portion of the hollow insulator 28 and is electrically connected to the metal pipe 26 that is connected to the other side of the hollow insulator 28. The dielectric 36 is disposed between the first electrode 32 and the second electrode 34. Lead portions of the electrodes 32 and 34 and the metal pipes 26 are bonded by soldering, for example, and may also be electrically connected by pressure welding using a heat shrink tube.

The material of the metal pipe 26 includes copper, aluminum, an alloy thereof, and stainless steel, for example, but not limited to the foregoing.

The hollow insulator 28 is an insulating pipe in the example shown in FIG. 2. The material of the hollow insulator 28 includes glass, ceramics such as alumina, fluororesin, polyethylene (PE), and engineering plastics (e.g. polyphenylene sulfide (PPS) and polyetheretherketone (PEEK)), for example, but not limited to the foregoing.

The electrodes 32 and 34 are metal membranes, foils, films, and sheets, for example. The material of the electrodes 32 and 34 includes aluminum, copper, and an alloy thereof, for example, but not limited to the foregoing.

The material of the dielectric 36 includes polythylene telephthalate (PET), polypropylene (PP), polyphenylene sulfide (PPS), polyethylene naphthalate (PEN), and polyimide (PI), for example, but not limited to the foregoing.

Each condenser 30 may include a layer of the first electrode 32, a layer of the second electrode 34, and a layer of the dielectric 36 (in the example shown by FIG. 2) or include a plurality of layers of the first electrode 32, the second electrode 34, and the dielectric 36.

Figure 3:
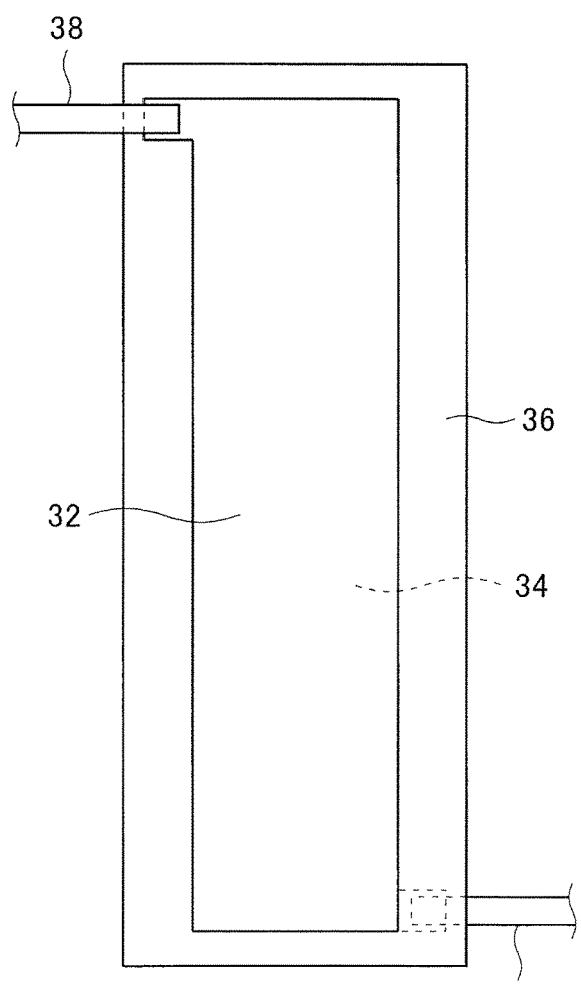
FIG. 3 is an expanded plan view showing an example of the film-shaped dielectric and electrodes used for formation of the condenser of the antenna.

The first electrode 32, the second electrode 34, and the dielectric 36 may be individually disposed on the outer peripheral portion of the hollow insulator 28, or the film-shaped (or called sheet-shaped; the same hereinafter) dielectric and electrodes as shown in the example of FIG. 3 may be wound together on the outer peripheral portion of the hollow insulator 28.

In the example of FIG. 3, the structure is made as follows. The first electrode 32 is formed on one main surface of the film-shaped dielectric 36 by metal deposition, for example. The second electrode 34 is formed at a position overlapping the electrode 32 on the other main surface (the back side of the paper) by metal deposition, for example. Connection conductors 38 and 40 are respectively connected to leading-out portions of the two electrodes 32 and 34.

Such film-shaped dielectric and electrodes may be wound a desired number of times (e.g. one or multiple times) on the outer peripheral portion of the hollow insulator 28 and the connection conductors 38 and 40 may be connected to the left and right metal pipes 26 respectively. In the case where the film-shaped dielectric and electrodes are wound multiple times, one more dielectric film may be sandwiched therebetween. By winding the film-shaped dielectric and electrodes multiple times, a plurality of layers of the first electrode 32, the second electrode 34, and the dielectric 36 can be respectively disposed in a simple way. Two pieces of the film-shaped dielectric 36 with the electrode (equivalent to the electrode 32 or the electrode 34) disposed on one surface thereof may be overlapped to be wound the desired number of times on the outer peripheral portion of the hollow insulator 28. Metal foils may be used as the electrodes 32 and 34. Fixing and connection of the aforementioned components that form the condenser 30 may be performed by using a heat shrink tube, for example.

A electrostatic capacity C of each condenser 30 can be expressed by the following known equation. S is the area of the electrodes 32 and 34 that face each other, d is a distance between the two electrodes 32 and 34, and c is a dielectric constant of the dielectric 36. Accordingly, the electrostatic capacity C can be adjusted by changing at least one of S, d, and E. If a plurality of layers of the electrodes 32 and 34 and the dielectric 36 are disposed respectively, the area S increases and therefore the electrostatic capacity C increases.

$$C = \in \cdot S/d \qquad \text{[Equation 1]}$$

Each connecting portion of the left and right metal pipes 26 and the hollow insulator 28 may have the tapered thread structure for pipe, as shown in FIG. 4. That is, in this example, a tapered female thread portion 42 made of metal is respectively bonded to the ends of the left and right metal pipes 26, into which the hollow insulator 28 having tapered male thread portions 29 on two ends is screwed. The material of the hollow insulator 28 is preferably the harder one (e.g. engineering plastics) of the materials described above. A sealing tape may be interposed between each tapered thread portion 42 and the tapered thread portion 29. With such tapered thread structure for pipe, each connecting portion can also have the sealing function with respect to vacuum and the cooling water 44. The aforementioned condenser 30 may be disposed on the outer peripheral portion of the hollow insulator 28.

With reference to FIG. 1 again, insulating parts 46 are respectively disposed in the portions where two ends of the antenna 20 pass through the vacuum chamber 2 to the outside. The metal pipes 26 at two ends of the antenna body 24 pass through the insulating parts 46 respectively and the through portion is vacuum sealed by a packing 48, for example. The portion between each insulating part 46 and the vacuum chamber 2 is also vacuum sealed by a packing 50, for example. The insulating pipe 22 is in the vacuum chamber 2 with two ends supported by the insulating parts 46. As shown in this example, processing of leading-out of the antenna 20 from the vacuum region to the atmospheric region is easy if performed on the portion of the metal pipe 26. Sealing may not be provided between the two ends of the insulating pipe 22 and the insulating parts 46. Since the space 23 is small and the traveling distance of electrons is short, even if the gas 8 enters the space 23 in the insulating pipe 22, usually plasma generation does not occur in the space 23.

Considering electrical insulation, the cooling water 44 that flows inside the antenna body 24, i.e. inside each metal pipe 26 and each hollow insulator 28, is preferably high-resistance water. For example, it is preferred to use pure water or water that is nearly pure. When the high frequency current $I_R$ is applied to each metal pipe 26, since each metal pipe 26 has a resistance, the metal pipe 26 generates heat (i.e. generates Joule heat). Although the heat is also transmitted to the hollow insulator 28 and the condenser 30, these components 26, 28, and 30 can be cooled by the cooling water 44 to lower the temperature. The condenser 30 can also be cooled mainly by thermal conduction with the hollow insulator 28 and the cooling water 44.

The high frequency power source 56 is connected to a power supply end 52, which is one end of the antenna 20 (more specifically, the antenna body 24 thereof), via a matching circuit 58. A terminal 54, which is the other end, is grounded by a ground point 60 via a return conductor 62. The terminal 54 may be directly grounded without passing through the condenser, and the condenser 64 may be connected in series to the return conductor 62 as shown in this example. The reason will be explained later. With the above configuration, the high frequency current $I_R$ can be applied from the high frequency power source 56 to the antenna 20 (more specifically, the antenna body 24 thereof) via the matching circuit 58.

Generally, the frequency of the high frequency power and the high frequency current $I_R$ outputted from the high frequency power source 56 is 13.56 MHz, for example, but not limited thereto.

By applying the high frequency current $I_R$ to the antenna 20, a high frequency magnetic field is generated around the antenna 20 and thereby an induced electric field is generated in the direction opposite to the high frequency current IR. In the vacuum chamber 2, electrons are accelerated by the induced electric field to ionize the gas 8 near the antenna 20, so as to generate the plasma 16 (i.e. inductively coupled plasma) near the antenna 20. The plasma 16 diffuses to the vicinity of the substrate 10, so as to perform the aforementioned processing on the substrate 10 with the plasma 16.

The antenna 20 is an internal antenna disposed in the vacuum chamber 2, and since the high frequency magnetic field created by the high frequency current $I_R$ flowing through the antenna 20 can be used effectively to generate the plasma 16 from the vicinity, the efficiency of plasma generation is high compared to the case of an external antenna. This effect is called the effect 1 for reference hereinafter.

Furthermore, the antenna body 24 that constitutes the antenna 20 has the structure that a plurality of metal pipes 26 are electrically connected in series by the layered condenser 30 disposed on the outer peripheral portion of the hollow insulator 28, and simply put, because the combined reactance of the antenna body 24 takes the form of subtracting the capacitive reactance from the inductive reactance, the impedance of the antenna 20 can be reduced. This effect is called the effect 2 for reference hereinafter.

Figure 5A:
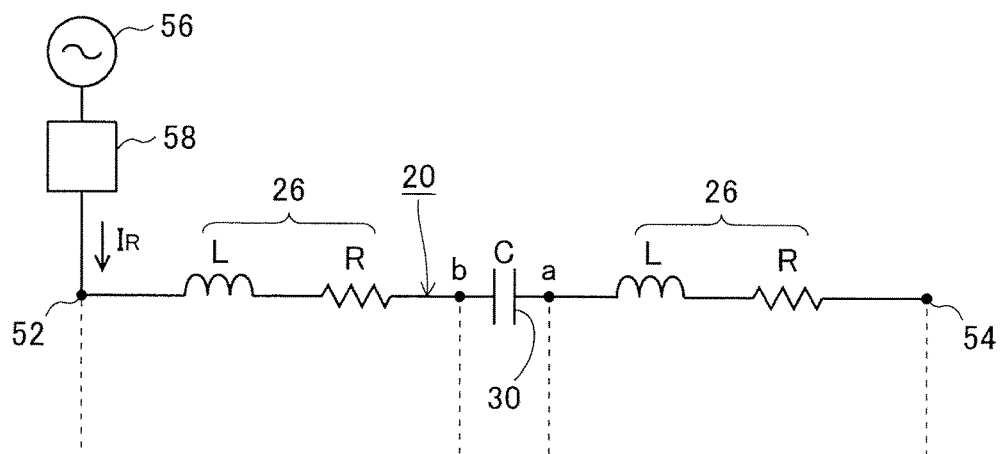
FIG. 5 includes FIG. 5(A) and FIG. 5(B) that show an example of the equivalent circuit of the antenna of FIG. 1 and the potential distribution when the series resonance conditions are satisfied.

In detail, the equivalent circuit of the antenna 20 (more specifically, the antenna body 24 thereof) as shown in FIG. 1 is shown in FIG. 5(A). Herein, the inductance of each metal pipe 26 is denoted as L, the resistance is denoted as R, and the electrostatic capacity of the condenser 30 is denoted as C. The inductance L and the resistance R of each metal pipe 26 can have substantially the same value if each metal pipe 26 has substantially the same length. An impedance Z of the antenna 20 can be represented by the following equation, wherein ω represents the angular frequency of the high frequency current $I_R$ and j represents an imaginary unit.

$$Z=2R+j(2\omega L-1/\omega C) \qquad \text{[Equation 2]}$$

The imaginary part in the above equation is the combined reactance of the antenna body 24 and takes the form of subtracting the capacitive reactance 1/ωC from the inductive reactance 2ωL. Therefore, by series connection of the condenser 30, the impedance Z of the antenna 20 can be reduced. In other words, according to the antenna 20, since the numbers of the metal pipes 26 and the condenser 30 that constitute the antenna body 24 can be suitably selected, the impedance Z of the antenna 20 can be set to an appropriate value regardless of the length of the antenna 20.

As a result, even if the antenna 20 is lengthened to cope with size increase of the substrate 10, increase of the impedance Z can be suppressed. Accordingly, occurrence of a large potential difference between two ends of the antenna 20 can be suppressed. Thereby, the plasma 16 having good uniformity can be generated. In addition, uniformity of processing of the substrate 10 can be improved.

Moreover, since increase of the impedance Z can be suppressed even if the antenna 20 is lengthened, the high frequency current $I_R$ can easily flow to the antenna 20 and the inductively coupled plasma 16 can be generated efficiently. Also, efficiency of processing of the substrate 10 can be improved. This effect is called the effect 3 for reference hereinafter.

As clear from the above description, the electrostatic capacity C of the condenser 30 is preferably set in advance in a manner that the imaginary part (e.g. the imaginary part in the above equation 2) of the impedance of the antenna body 24, more strictly speaking, the imaginary part at generation of the plasma 16, is as small as possible. The reason for specifying "at generation of the plasma 16" is that, because it is known by experience that the inductance L is reduced when plasma is generated, it is preferred to design the invention in advance in expectation of the reduction. The series resonance conditions are satisfied when the imaginary part becomes 0, which is preferred. However, the series resonance conditions do not necessarily have to be satisfied. The imaginary part may be set to ±50Ω or less, preferably ±10Ω or less, for example.

Figure 5B:
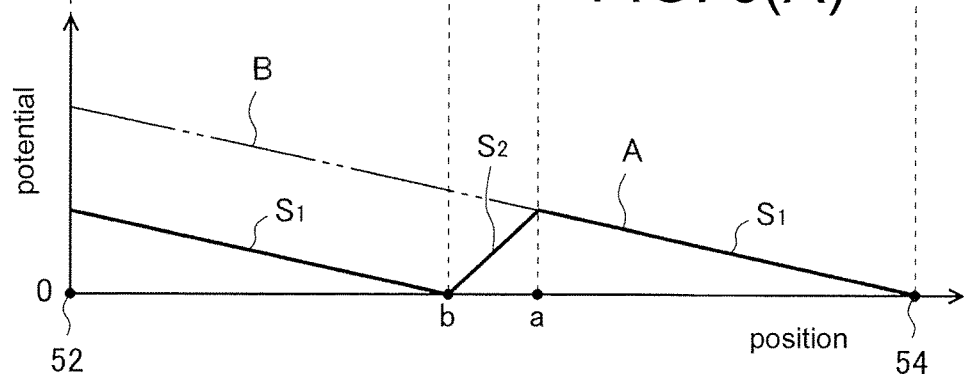

In a case where the series resonance conditions are satisfied in the circuit in FIG. 5(A) when the high frequency current $I_R$ is applied to the antenna 20, an example of the potential distribution of the antenna 20 is shown by the solid line A in FIG. 5(B). In FIG. 5(B), to simplify the description, the resistance R is ignored and the potential of the terminal 54 of the antenna 20 is shown as reference. The inclined portion $S_1$ indicates a potential rise caused by the inductive reactance ωL, and the inclined portion $S_2$ indicates a potential drop caused by the capacitive reactance 1/ωC.

The chain double-dashed line B in FIG. 5(B) indicates the potential distribution when the antenna is a conventional mere conductor without having a component equivalent to the condenser 30.

As clear from FIG. 5(B), in the case of the antenna 20, the potential difference between two ends thereof can be suppressed to be small. Accordingly, the plasma 16 having good uniformity can be generated. In addition, uniformity of substrate processing can be improved.

If the series resonance conditions are not satisfied, e.g. the potential at point B in FIG. 5(B) shifts to some extent to the positive side or to the negative side, accordingly, the potential of the other portions will also shift. Still, compared to the conventional mere conductor shown by the chain double-dashed line B, the potential difference between two ends of the antenna can be suppressed to be small.

Since the antenna body 24 that constitutes the antenna 20 has the layered condenser 30 that is disposed on the outer peripheral portion of the hollow insulator 28, the distance between the metal pipe 26 and the insulating pipe 22 outside the metal pipe 26 is prevented from increasing and the resistance to the cooling water 44 flowing inside is prevented from increasing. This effect is called the effect 4 for reference hereinafter.

In detail, if a condenser as an electronic part disclosed in FIG. 2, etc. of Patent Literature 3 for example (i.e. a condenser that is completed as an electronic part itself and can be treated as an independent electronic part), instead of the aforementioned condenser 30, is attached to the outside of the hollow insulator 28, since the size of the condenser needs to be increased to ensure the withstand voltage and electrostatic capacity, the insulating pipe 22 will have to be thickened. In that way, the following inconveniences may occur: (a) the distance between the metal pipe 26 inside the insulating pipe 22 and the plasma 16 outside the insulating pipe 22 is increased, which causes reduction in generation efficiency of the plasma 16; (b) unwanted plasma may be generated in the thickened insulating pipe 22; and so on. According to the aforementioned condenser 30, occurrence of such inconveniences can be prevented.

In addition, if the condenser as an electronic part is attached to the inside of the hollow insulator 28, the following inconveniences may occur: (a) the condenser may greatly hinder the flow of the cooling water 44 so as to reduce cooling performance of the antenna; (b) if the metal pipe 26 and the hollow insulator 28 are considerably thickened in order to improve the above problem, as described in the problem of Patent Literature 3, the area of the metal pipe 26 is increased so that the potential distribution is easily transferred to the film on the surface of the substrate, and film thickness distribution may become disordered; and so on. According to the aforementioned condenser 30, occurrence of such inconveniences can also be prevented.

As described above, the number of the metal pipes 26 that constitute the antenna body 24 of the antenna 20 is set to three or more, and the hollow insulator 28 and the condenser 30 may be respectively disposed between the metal pipes 26. In that way, the potential distribution of the antenna 20 is divided into smaller sections than that shown in FIG. 5, so that the potential difference between two ends of the antenna 20 can be reduced.

Each condenser 30 may include a plurality of layers of the first electrode 32, the second electrode 34, and the dielectric 36, as described above. In that way, it becomes easy to increase the electrostatic capacity C of each condenser 30. Thereby, the combined reactance of the antenna body 24 is reduced, making it easier to reduce the impedance Z of the antenna 20.

Like the example shown in FIG. 1 and so on, the antenna body 24 that constitutes the antenna 20 is preferably disposed in advance in the insulating pipe 22 with the space 23 therebetween. In that way, due to the presence of the space 23, the potential of the surface of the insulating pipe 22 can be suppressed from rising, and thus the plasma potential can be suppressed from rising.

In detail, as described above, by application of the high frequency current IR, the potential of the antenna body 24 rises (e.g. see FIG. 5). In this case, if the space 23 is present between the antenna body 24 and the insulating pipe 22, since the small electrostatic capacity $C_3$ exist in the space 23 and the relatively large electrostatic capacity $C_4$ exist in the thickness of the insulating pipe 22 are connected in series between the antenna body 24 and the surface of the insulating pipe 22, the series combined electrostatic capacity is small. Accordingly, the surface of the insulating pipe 22 becomes unlikely to be influenced by the rise in potential of the antenna body 24, and thus the potential of the surface of the insulating pipe 22 can be suppressed from rising. Thereby, the potential of the plasma 16 can be suppressed from rising. In contrast, if the antenna body 24 (specifically, the metal pipe 26 thereof) touches the inner wall of the insulating pipe 22 without via the space 23, since the electrostatic capacity $C_3$ in the series is no longer present, the surface of the insulating pipe 22 becomes likely to be influenced by the rise in potential of the antenna body 24, so that the potential of the surface of the insulating pipe 22 is increased. Thereby, the rise in potential of the plasma 16 also increases.

As shown in the example of FIG. 1, the condenser 64 may be connected in series to the return conductor 62 of the antenna circuit in advance. Impedance and resistance are also exist in the return conductor 62. With the condenser 64 disposed in advance, the imaginary part of the impedance of the entire close loop of the high frequency current $I_R$ can be reduced due to the capacitive reactance thereof to reduce the impedance. Accordingly, it becomes easy to apply the high frequency current $I_R$ to the antenna 20. The electrostatic capacity $C_2$ of the condenser 64 may be, for example, set to a level such that the capacitive reactance thereof can counteract the inductive reactance exist in the return conductor 62, for example.

(2) Other Embodiments of the Antenna and so on

Next, several other embodiments of the antenna 20, etc. are explained. In the following, the same reference numerals denote the same or equivalent portions as those of the embodiments described previously with reference to FIG. 1 to FIG. 5, and mainly the differences from the previous embodiments are described. In addition, mainly the differences between the following embodiments are described.

Referring to FIG. 2 for example, the antenna 20 of the previous embodiment has a structure that the condenser 30 is disposed on the outer peripheral surface of the hollow insulator 28 and lead portions (or the connection conductors 38 and 40 of FIG. 3) extend from the first electrode 32 and the second electrode 34 onto the metal pipes 26 to be connected.

As described above, the material of the hollow insulator 28 includes glass, ceramics such as alumina, or engineering plastics such as polyetheretherketone (PEEK) and polyphenylene sulfide (PPS), for example, which generally have a thermal conductivity much smaller than metal. Examples of the thermal conductivity of several materials are provided as follows.

PEEK: about 0.26 [W/mK]
PPS: about 0.3-0.55 [W/mK]
glass: about 1 [W/mK]
aluminum: about 236 [W/mK]
copper: about 398 [W/mK]

Because the hollow insulator 28 has low thermal conductivity, even though the cooling water 44 flows in the hollow insulator 28, the cooling effect of the condenser 30 is not very good. Regarding this, there is room for improvement. In addition, it is also desirable to further simplify the structure of the portion of the condenser 30.

Several embodiments of the antenna 20 for further improving these points are described hereinafter.

Figure 6:
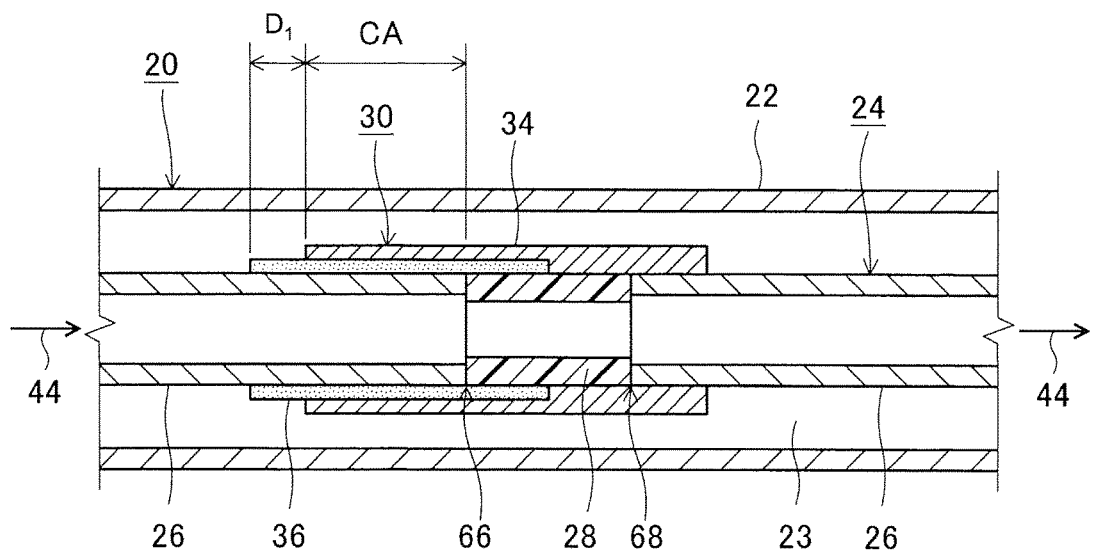
FIG. 6 is a schematic sectional view showing an example of the area around the condenser of the antenna according to another embodiment of the invention.

In the antenna 20 of the embodiment shown in FIG. 6, the antenna body 24 also has the condenser 30 that is electrically connected in series to the metal pipes 26 on two sides of the hollow insulator 28. In other words, it is the structure that the metal pipes 26 on two sides of the hollow insulator 28 and the condenser 30 are electrically connected in series. Accordingly, the equivalent circuit of the antenna 20 is the same as the equivalent circuit shown in FIG. 5 in the case of one condenser 30 portion.

The configuration of the condenser 30 is explained as follows. That is, if the connecting portion that connects one end of the hollow insulator 28 with the metal pipe 26 is called a first connecting portion 66 and the connecting portion that connects the other end with the metal pipe 26 is called a second connecting portion 68, (a) a portion of the metal pipe 26 on the side of the first connecting portion 66 also serves as the first electrode of the condenser 30, and the condenser 30 includes (b) a dielectric 36 disposed in a region from the outer peripheral portion of the metal pipe 26 on the side of the first connecting portion 66 to the outer peripheral portion of the hollow insulator 28; and (c) a second electrode 34 disposed in a region from the outer peripheral portion of the dielectric 36 to the outer peripheral portion of the metal pipe 26 on the side of the second connecting portion 68 and electrically connected to the metal pipe 26 on the side of the second connecting portion 68, wherein the second electrode 34 includes a region CA that overlaps the metal pipe 26 on the side of the first connecting portion 66 with the dielectric 36 interposed therebetween. In other words, the dielectric 36 is disposed across the outer peripheral portion of the metal pipe 26 on the side of the first connecting portion 66 and the outer peripheral portion of the hollow insulator 28. The second electrode 34 is disposed to cross from the outer peripheral portion of the dielectric 36 on the metal pipe 26 on the side of the first connecting portion 66 to the outer peripheral portion of the metal pipe 26 on the side of the second connecting portion 68.

The overlap region CA is where the electrostatic capacity is formed and therefore can be called an electrostatic capacity forming region. In the condenser 30, a portion of the metal pipe 26 that includes the electrostatic capacity forming region CA is also used as the first electrode of the condenser.

Examples of the materials of the metal pipe 26, the hollow insulator 28, the second electrode 34, and the dielectric 36 are as described above.

The end of the dielectric 36 on the side of the hollow insulator 28 may extend beyond the second connecting portion 68 to the outer peripheral portion of the metal pipe 26 on the side of the second connecting portion 68. However, it should not interfere with the electrical connection between the second electrode 34 and the metal pipe 26 on that side.

The second electrode 34 on the metal pipe 26 on the side of the first connecting portion 66 is preferably disposed to cover the dielectric 36, excluding a predetermined distance $D_1$ from the front end of the dielectric 36 in the axial direction. In that way, a creepage distance between the metal pipe 26 on that side and the second electrode 34 is increased. Therefore, the withstand voltage between them can be enhanced. Accordingly, the length of the distance $D_1$ may be determined according to the required withstand voltage.

The electrostatic capacity C of the condenser 30 can be represented by the following equation, which is the same as the equation 1 described above. S is the area of the electrostatic capacity forming region CA, d is the distance between the second electrode 34 and the metal pipe 26 thereunder, and s is the dielectric constant of the dielectric 36. As in other embodiments which will be described later (refer to FIG. 7, FIG. 9, etc.), in the case where metal films 70 and 72 are formed on two surfaces of the dielectric 36 or the dielectric sheet 36a, S denotes the area of the electrostatic capacity forming region CA where the two metal films 70 and 72 face each other, d denotes the thickness of the dielectric 36 or the dielectric sheet 36a, and $\in$ denotes the dielectric constant of the dielectric 36 or the dielectric sheet 36a. Accordingly, the electrostatic capacity C of the condenser 30 can be adjusted by changing at least one of S, d, and $\in$.

$$C = \in \cdot S/d \qquad \text{[Equation 3]}$$

In the case of this embodiment, the connecting portion that connects the hollow insulator 28 with the metal pipes 26 on two sides may also adopt the tapered thread structure for pipe, as shown in the example of FIG. 4. In that case, the metallic tapered female thread portion 42 (see FIG. 4) bonded to the end of the metal pipe 26 is made of metal and is electrically connected with the metal pipe 26, and thus may be considered as a portion of the metal pipe 26 in the embodiment of FIG. 6. The same also applies to the other embodiments which will be described later.

Since the antenna 20 of this embodiment also has the aforementioned condenser 30 that is electrically connected in series to the metal pipes 26 on two sides of the hollow insulator 28, the antenna 20 of this embodiment achieves the same effects (i.e. the effects 1-4) as the antenna 20 of the previous embodiment. Regarding the effect 4, the condenser 30 of this embodiment has the configuration that uses a portion of the metal pipe 26 on the side of the first connecting portion 66 as the first electrode of the condenser 30 and includes the dielectric 36 on the outer peripheral portion thereof and further includes the second electrode 34 on the outer peripheral portion thereof. Thus, the distance between the metal pipe 26 and the insulating pipe 22 outside the metal pipe 26 is prevented from increasing, and the resistance to the cooling water 44 flowing inside is prevented from increasing.

In addition to the above, the antenna 20 of this embodiment further achieves the following effects.

The condenser 30 includes a portion of the metal pipe 26 on the side of the first connecting portion 66 as the first electrode of the condenser 30, and the dielectric 36 disposed in a region from the outer peripheral portion of the metal pipe 26 to the outer peripheral portion of the hollow insulator 28. Moreover, the cooling water 44 flows through the metal pipe 26. Thus, due to the high thermal conductivity of the metal pipe 26, the dielectric 36 can be efficiently cooled. As exemplified above, the thermal conductivity of aluminum, copper, etc. used for the metal pipe 26 is much larger than the insulating material used for the hollow insulator 28. As a result, damage caused by temperature rise of the dielectric 36 due to application of the high frequency power can be suppressed to improve heat resistance of the condenser 30.

In addition, since the condenser 30 includes a portion of the metal pipe 26 on the side of the first connecting portion 66 as the first electrode of the condenser 30, the first electrode may not be disposed separately, and accordingly, structure simplification and decrease in number of the members can be realized.

Figure 7:
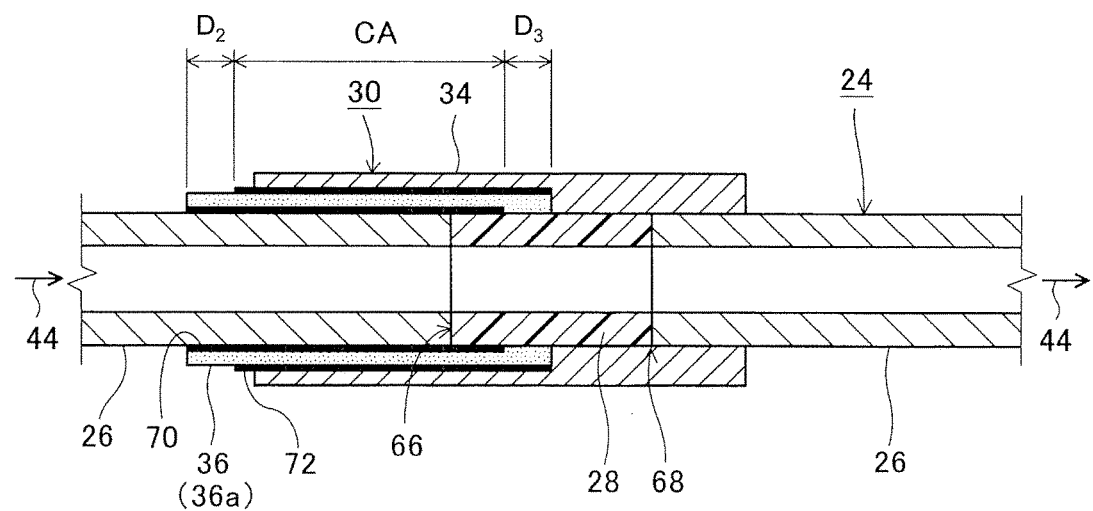
FIG. 7 is a schematic sectional view showing another example of the area around the condenser of the antenna according to another embodiment of the invention, in which the insulating pipe is omitted.

As shown in the embodiment of FIG. 7, the metal films 70 and 72 on the inner surface and outer surface of the dielectric 36 that forms the condenser 30 may be formed to face each other and be electrically insulated from each other. In that case, the metal film 70 on the inner surface is electrically connected to the metal pipe 26 on the side of the first connecting portion 66 and the metal film 72 on the outer surface is electrically connected to the second electrode 34.

Figure 9:
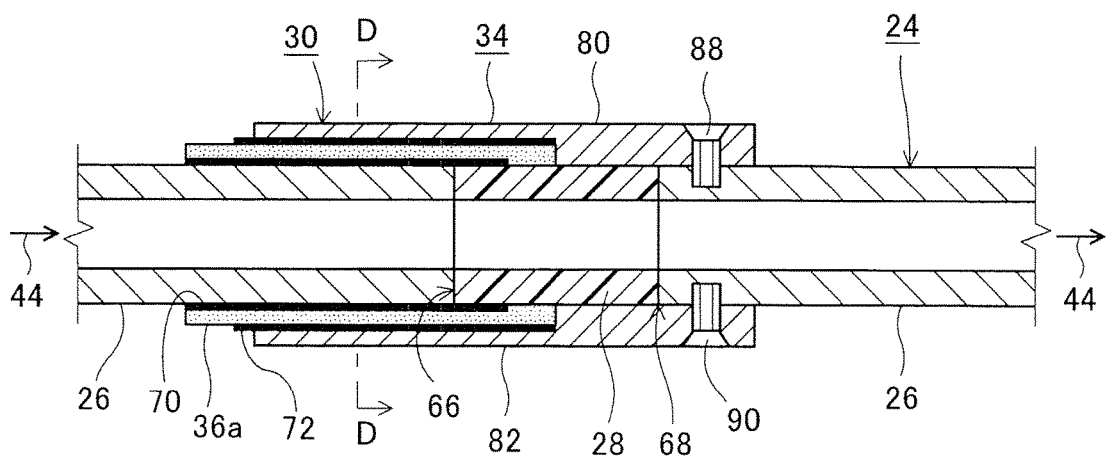
FIG. 9 is a schematic sectional view further showing another example of the area around the condenser of the antenna according to another embodiment of the invention, in which the insulating pipe is omitted.
Figure 10:
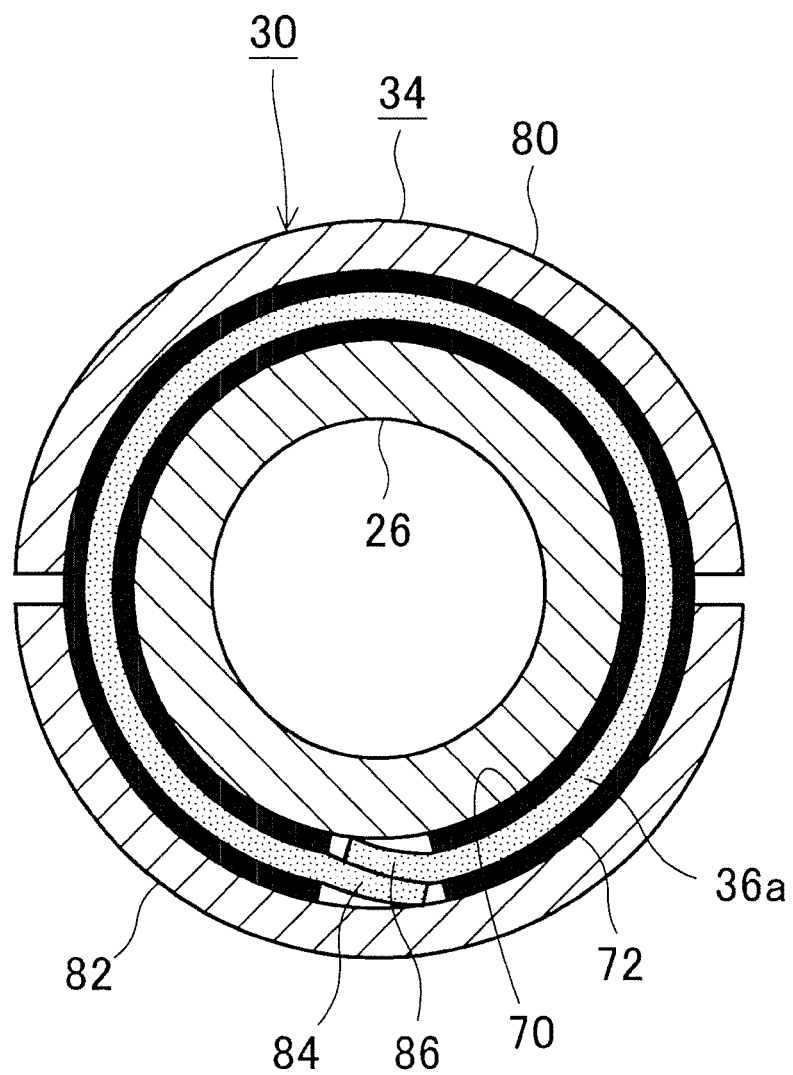
FIG. 10 is an enlarged sectional view along the line D-D of FIG. 9.

In FIG. 7, FIG. 9, and FIG. 10, the insulating pipe 22 is omitted; however, the antenna is provided with the insulating pipe 22 like the previous embodiment.

The conventional thin film forming means, such as vacuum deposition, ion plating, and sputtering, may be adopted as the means for forming the metal films 70 and 72 on the dielectric 36. The material of the metal films 70 and 72 includes aluminum, copper, and an alloy thereof, for example, but not limited to the foregoing.

In the case of the previous embodiment, as shown in the example of FIG. 7, it is preferable to form the metal film 72 on the outer surface of the dielectric 36 excluding a predetermined distance $D_2$ from the front end in the axial direction, and form the metal film 70 on the inner surface excluding a predetermined distance $D_3$ from the front end on the opposite side in the axial direction. The two distances $D_2$ and $D_3$ may be set to be $D_2 \approx D_3$, for example. By doing so, the creepage distances between the two metal films 70 and 72 and the metal pipe 26 and the second electrode 34 increase. Therefore, the withstand voltage between them can be enhanced. Accordingly, the lengths of the two distances $D_2$ and $D_3$ may be determined according to the required withstand voltage. The above also applies to the metal films 70 and 72 formed on the dielectric sheet 36a, which will be described later.

In the case where the condenser 30 portion has the aforementioned structure, the electrostatic capacity forming region CA thereof is the region where the two metal films 70 and 72 face each other, which has the advantage of making the electrostatic capacity forming region CA wider than that of the embodiment of FIG. 6.

By forming the condenser 30 portion into the aforementioned structure, the electrostatic capacity of the condenser 30 is definitely determined by the dielectric 36 and the metal films 70 and 72 formed on two sides of the dielectric 36. Therefore, high precision is no longer required for machining and installation of the metal pipe 26 and the second electrode 34 of the portion that constitutes the condenser 30. Consequently, manufacturing of the condenser 30 portion becomes easy.

In detail, in the case of the structure as shown in FIG. 6, if a gap is present between the dielectric 36 and the metal pipe 26 inside the dielectric 36 or the second electrode 34 outside, the electrostatic capacity may not conform to the design and may vary from the design value. To eliminate the gap, one approach is to improve the precision of machining and installing the metal pipe 26 and the second electrode 34 of the portion that constitutes the condenser 30. In the structure as shown in FIG. 7, however, the electrostatic capacity of the condenser 30 is definitely determined by the dielectric 36 and the metal films 70 and 72 formed on two surfaces thereof without being influenced by the machining precision and installation precision of the metal pipe 26 and the second electrode 34 of the aforementioned portion. Therefore, high precision is no longer required for machining and installation of the metal pipe 26 and the second electrode 34 of the aforementioned portion. Consequently, manufacturing of the condenser 30 portion becomes easy.

As a variant of the condenser 30 portion shown in FIG. 7, the dielectric 36 may be formed of a dielectric sheet 36a and the metal films 70 and 72 may be formed on two main surfaces of the dielectric sheet 36a to face each other and be electrically insulated from each other. A plan view showing an example of the dielectric sheet 36a with the metal films thereon is illustrated in FIG. 8.

Figure 8:
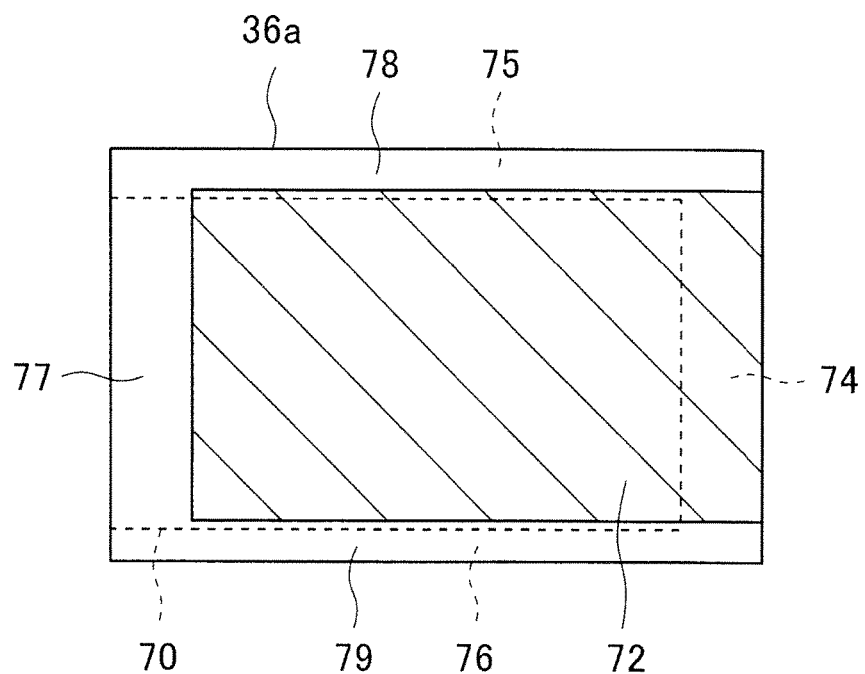
FIG. 8 is a plan view showing an example of the dielectric sheet with the metal film.

To make the metal film 70 on the back side of the dielectric sheet 36a more comprehensible, the metal film 72 on the front side is slightly shifted in FIG. 8. Such shift is not necessary for the actual condenser. Moreover, the hatching in FIG. 8 is intended to emphasize the region of the metal film 72, rather than representing a cross-section.

As shown in FIG. 8, the metal film 70 is formed on one main surface (the back surface side of the figure) of the dielectric sheet 36a and the metal film 72 is formed on the other main surface (the front surface side of the figure) to be opposite to the metal film 70, and the two metal films 70 and 72 are electrically insulated from each other. More specifically, metal film non-forming regions 74-76 respectively having a predetermined width are formed on three sides of the metal film 70 that is formed on one main surface of the dielectric sheet 36a. Likewise, metal film non-forming regions 77-79 respectively having a predetermined width are formed on three sides of the metal film 72 that is formed on the other main surface of the dielectric sheet 36a. The reason for disposing these will be explained later.

Examples of the means for forming the metal films 70 and 72 on the dielectric sheet 36a and the material of the metal films 70 and 72 are the same as above. Examples of the material of the dielectric sheet 36a are the same as those of the dielectric 36.

FIG. 10 is a sectional view along the line D-D of FIG. 9, which is the same as the example of FIG. 7, except for the configuration of the second electrode 34. Thus, the aforementioned variant of the condenser 30 portion as shown in FIG. 7 is further described with reference to FIG. 10, wherein the dielectric sheet 36a with the metal films, except for the ends in the circumferential direction, is wound once on the region from the outer peripheral portion of the metal pipe 26 on the side of the first connecting portion 66 to the outer peripheral portion of the hollow insulator 28. The reason is to avoid a short circuit that may occur between the metal films 70 and 72 on the front and back sides when the dielectric sheet 36a is wound twice. The ends 84 and 86 of the dielectric sheet 36a in the circumferential direction overlap each other.

In this variant, the second electrode 34 is made of a metal sheet, which is wound to press down the dielectric sheet 36a in the region from the outer peripheral portion of the dielectric sheet 36a with the metal films to the outer peripheral portion of the metal pipe 26 on the side of the second connecting portion 68. The number of times of winding may be one or plural. The terminal end of the wound metal sheet may be fixed by using the conventional means, such as a heat shrink tube. By winding the metal sheet in the manner described above, the metal film 70 on one main surface of the dielectric sheet 36a is electrically connected to the metal pipe 26 and the metal film 72 on the other main surface is electrically connected to the second electrode 34.

The metal film non-forming regions 77 and 74 shown in FIG. 8 are portions respectively equivalent to the distances $D_2$ and $D_3$ shown in FIG. 7. In this way, the creepage distance in the axial direction of the condenser 30 (in other words, the axial direction of the antenna 20) can be increased to enhance the withstand voltage. In addition, by disposing the aforementioned metal film non-twining regions 75, 76, 78, and 79, the ends 84 and 86 without the metal films 70 and 72 can be formed in the circumferential direction of the dielectric sheet 36a wound as shown in FIG. 10. Thereby, the creepage distance from the ends of the dielectric sheet 36a in the circumferential direction to the metal films 70 and 72 can be increased to enhance the withstand voltage. Furthermore, with the ends 84 and 86 overlapping each other, the following effects can be achieved.

By forming the condenser 30 portion into the aforementioned structure, the electrostatic capacity of the condenser 30 is definitely determined by the dielectric sheet 36*a* and the metal films 70 and 72 formed on two sides of the dielectric sheet 36*a*. Therefore, high precision is no longer required for machining and installation of the metal pipe 26 and the second electrode 34 of the portion that constitutes the condenser 30. Consequently, manufacturing of the condenser 30 portion becomes easy. Details of the above are the same as specified in the case where the metal films 70 and 72 are formed on two sides of the dielectric 36.

In addition, as described with reference to FIG. 10, since the ends 84 and 86 of the dielectric sheet 36*a* in the circumferential direction overlap each other, the creepage distance between the metal pipe 26 and the second electrode 34 can be further increased and the withstand voltage between the metal pipe 26 and the second electrode 34 can be further enhanced.

Furthermore, since the metal sheet that constitutes the second electrode 34 is wound so as to press down the dielectric sheet 36*a* including the metal films, the heat resistance between the dielectric sheet 36*a* and the metal pipe 26 is reduced so that the cooling effect of the dielectric sheet 36*a* can be further improved. Meanwhile, electrical connection between the metal films 70 and 72 on two sides of the dielectric sheet 36*a* and the metal pipe 26 and the second electrode 34 can be ensured.

Other embodiments of the antenna, in which the condenser 30 has the dielectric sheet 36*a* with the metal films 70 and 72 described above, are illustrated in FIG. 9 and FIG. 10.

Regarding the condenser 30 portion, mainly the differences from the variant described with reference to FIG. 7 are explained below. In this embodiment, the second electrode 34 of the condenser 30 has the following configuration, instead of being formed of the aforementioned metal sheet. Except for this, this embodiment is the same as the variant of FIG. 7, and thus repetitive descriptions are omitted hereinafter.

That is, in this embodiment, the second electrode 34 of the condenser 30 includes a pair of semi-cylindrical electrodes 80 and 82. The second electrode 34 presses down the dielectric sheet 36*a* with the metal films from opposite sides by the two semi-cylindrical electrodes 80 and 82 and fixes the two semi-cylindrical electrodes 80 and 82 to the metal pipe 26 on the side of the second connecting portion 68 by a fixing means (screws 88 and 90 in this example), such that the metal film 70 on one main surface of the dielectric sheet 36*a* is electrically connected to the metal pipe 26 on the side of the first connecting portion 66 and the metal film 72 on the other main surface is electrically connected to the second electrode 34. Nevertheless, the fixing means may not necessarily be the screws 88 and 90.

By forming the condenser 30 portion into the aforementioned structure, the electrostatic capacity of the condenser 30 is definitely determined by the dielectric sheet 36*a* and the metal films 70 and 72 formed on two sides of the dielectric sheet 36*a*. Therefore, high precision is no longer required for machining and installation of the metal pipe 26 and the second electrode 34 of the portion that constitutes the condenser 30. Consequently, manufacturing of the condenser 30 portion becomes easy. Details of the above are the same as specified in the case where the metal films 70 and 72 are formed on two sides of the dielectric 36.

In addition, as described with reference to FIG. 10, since the ends 84 and 86 of the dielectric sheet 36*a* in the circumferential direction overlap each other, the creepage distance between the metal pipe 26 and the second electrode 34 can be further increased and the withstand voltage between the metal pipe 26 and the second electrode 34 can be further enhanced.

Furthermore, since the dielectric sheet 36*a* including the metal films is pressed down by the pair of semi-cylindrical electrodes 80 and 82 that constitutes the second electrode 34, the heat resistance between the dielectric sheet 36*a* and the metal pipe 26 is reduced so that the cooling effect of the dielectric sheet 36*a* can be further improved. Meanwhile, electrical connection between the metal films 70 and 72 on two sides of the dielectric sheet 36*a* and the metal pipe 26 and the second electrode 34 can be ensured.

In any of the above embodiments, the antenna 20 is not necessarily linear as described above and may be curved. In that case, the aforementioned effects can still be achieved. For example, the antenna 20 may be curved so as to conform to the planar shape of the substrate 10. In addition, the antenna 20 may also have a shape of being folded back at a middle portion (e.g. a long and thin U shape) or the like.

The plasma processing device as shown in FIG. 1 is provided with the aforementioned antenna 20 and thereby can efficiently generate the plasma 16 having good uniformity as specified above. Therefore, the uniformity and efficiency of the substrate processing can be improved.

Figure 11:
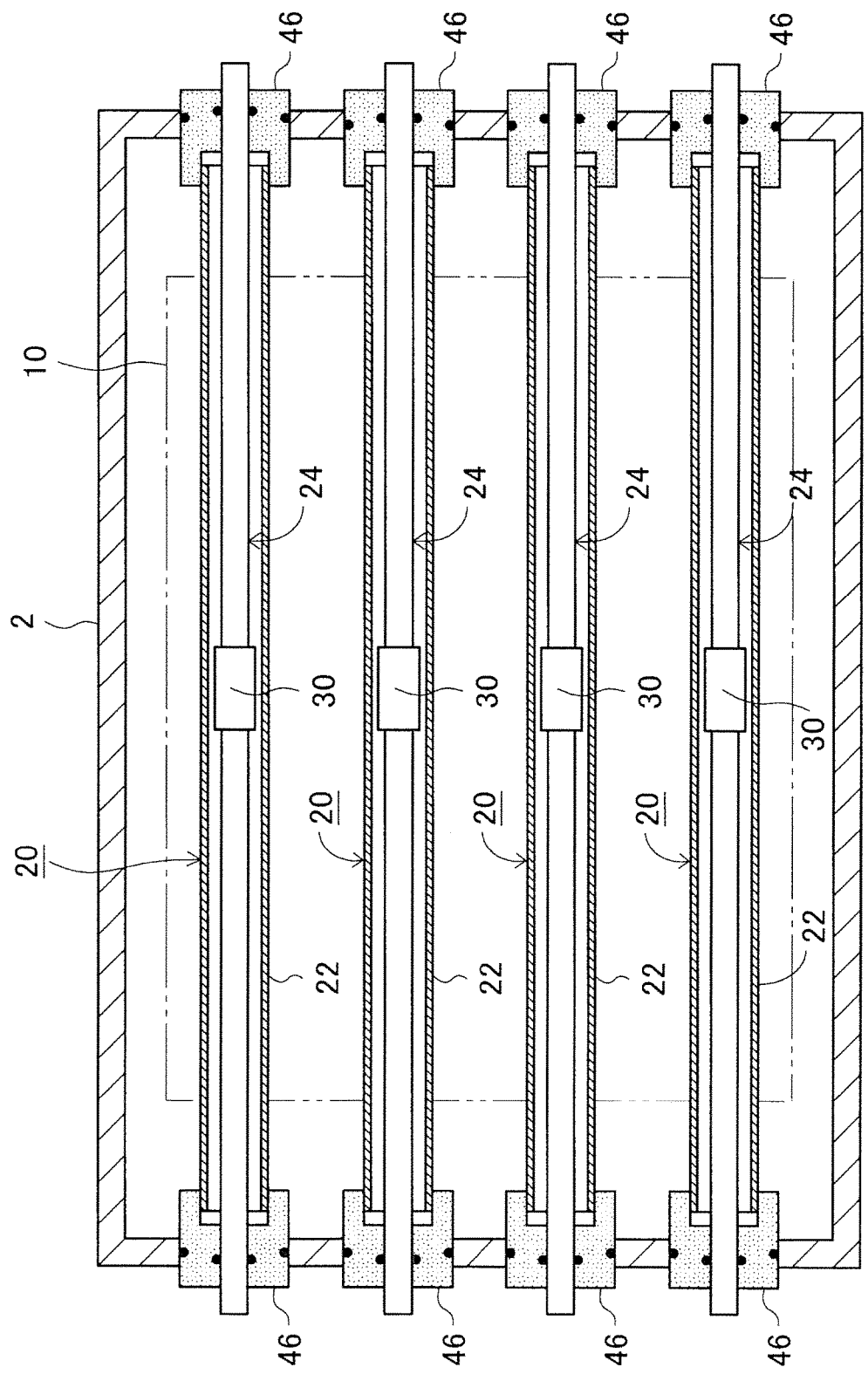
FIG. 11 is a schematic transverse sectional view showing an example of the plasma processing device that includes a plurality of linear antennas.

FIG. 11 is a schematic transverse sectional view showing an example of the plasma processing device that includes a plurality of the linear antennas 20. Mainly the differences between this example and the example shown in FIG. 1 and so on are explained below. As shown in this example, in the vacuum chamber 2, a plurality of the linear antennas 20 described above may be disposed in parallel in the direction along the surface of the substrate 10 (e.g. substantially parallel to the surface of the substrate 10). In that way, plasma having good uniformity can be generated in a wider region, and thus processing of a larger substrate can be coped with.

The high frequency current may be supplied to the plurality of antennas 20 by using common high frequency power source and matching circuit, for example. In that case, a variable impedance may be interposed respectively between the common matching circuit and each antenna 20 for balancing the high frequency currents flowing to the plurality of antennas 20. The high frequency current may also be supplied to the plurality of antennas 20 by using separate high frequency power sources and matching circuits.

In the case where a condenser equivalent to the condenser 64 of FIG. 1 is disposed, the condenser may be respectively connected in series to the return conductor (equivalent to the return conductor 62 of FIG. 1) of each antenna 20.

(3) Other Embodiments of the Plasma Processing Device and so on

Next, several other embodiments of the plasma processing device and so on are described. In the following, the same reference numerals denote the same or equivalent portions as those of the embodiments described previously with reference to FIG. 1 to FIG. 5, and mainly the differences from the previous embodiments are described. In addition, mainly the differences between the following embodiments are described.

Figure 12:
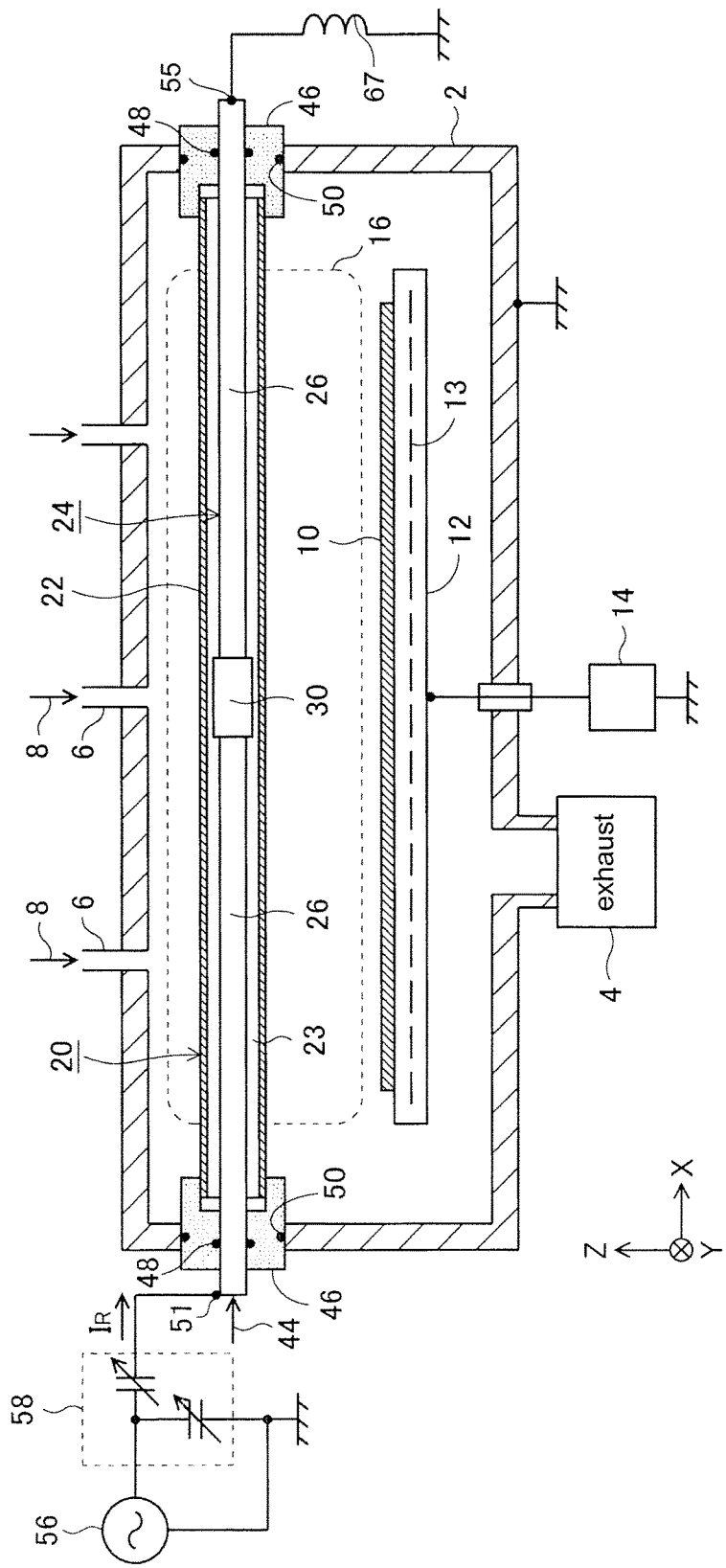
FIG. 12 is a schematic longitudinal sectional view showing another embodiment of the plasma processing device according to the invention.

The plasma processing device in the embodiment shown in FIG. 12 is a device generating an induced electric field in the vacuum chamber 2 by applying the high frequency current $I_R$ to the antenna 20 disposed in the vacuum chamber 2 to generate the inductively coupled plasma 16 and processing the substrate 10 with the plasma 16. More specifically, the plasma processing device includes: the vacuum chamber 2 evacuated and having the gas 8 introduced therein; the antenna 20 disposed in the vacuum chamber 2 and for generating the induced electric field in the vacuum chamber 2 by application of the high frequency current $I_R$ so as to generate the inductively coupled plasma 16; and the high frequency power source 56 supplying the high frequency current $I_R$ to the antenna 20, and the plasma processing device is configured to process the substrate 10 with the generated plasma 16.

The gas 8 is introduced into the vacuum chamber 2 through a flow controller (not shown) and the gas introduction pipe 6, for example. There may be one gas introduction pipe 6, or a plurality of gas introduction pipes 6 may be disposed along the longitudinal direction (the X direction) of the antenna 20 as in this embodiment. The gas 8 may be any gas corresponding to the content of the processing on the substrate 10. For example, if the film formation is performed on the substrate 10 by a plasma CVD method, the gas 8 is a gas obtained by diluting a source gas with a diluent gas (e.g. $H_2$). More specifically, if the source gas is $SiH_4$, a Si film can be formed on the surface of the substrate 10, and a SiN film, a $SiO_2$ film, and a SiN:F film (fluorinated silicon nitride film) can be formed respectively on the surface of the substrate 10 when the source gas is $SiH_4+NH_3$, $SiH_4+O_2$, and $SiF_4+N_2$.

In the plasma processing device in this embodiment, the high frequency power source 56 that supplies the high frequency current $I_R$ to the antenna 20 (more specifically, the antenna body 24 thereof) is connected to a power supply end 51 being one end of the antenna 20 (more specifically, the antenna body 24 thereof) via the matching circuit 58, and a terminal end 55 being the other end is grounded via the coil 67.

The antenna 20 of the plasma processing device in this embodiment can also be understood by referring to, e.g. FIG. 2. The structures of the first electrode 32, the second electrode 34, the dielectric 36 and the connection conductors 38 and 40 can also be understood by referring to, e.g. FIG. 3. Moreover, the connection structures of the metal pipe 26, the hollow insulator 28, the tapered thread portion 29 and the tapered thread portion 42 can also be understood by referring to, e.g. FIG. 4.

Figures 13A, 13B:
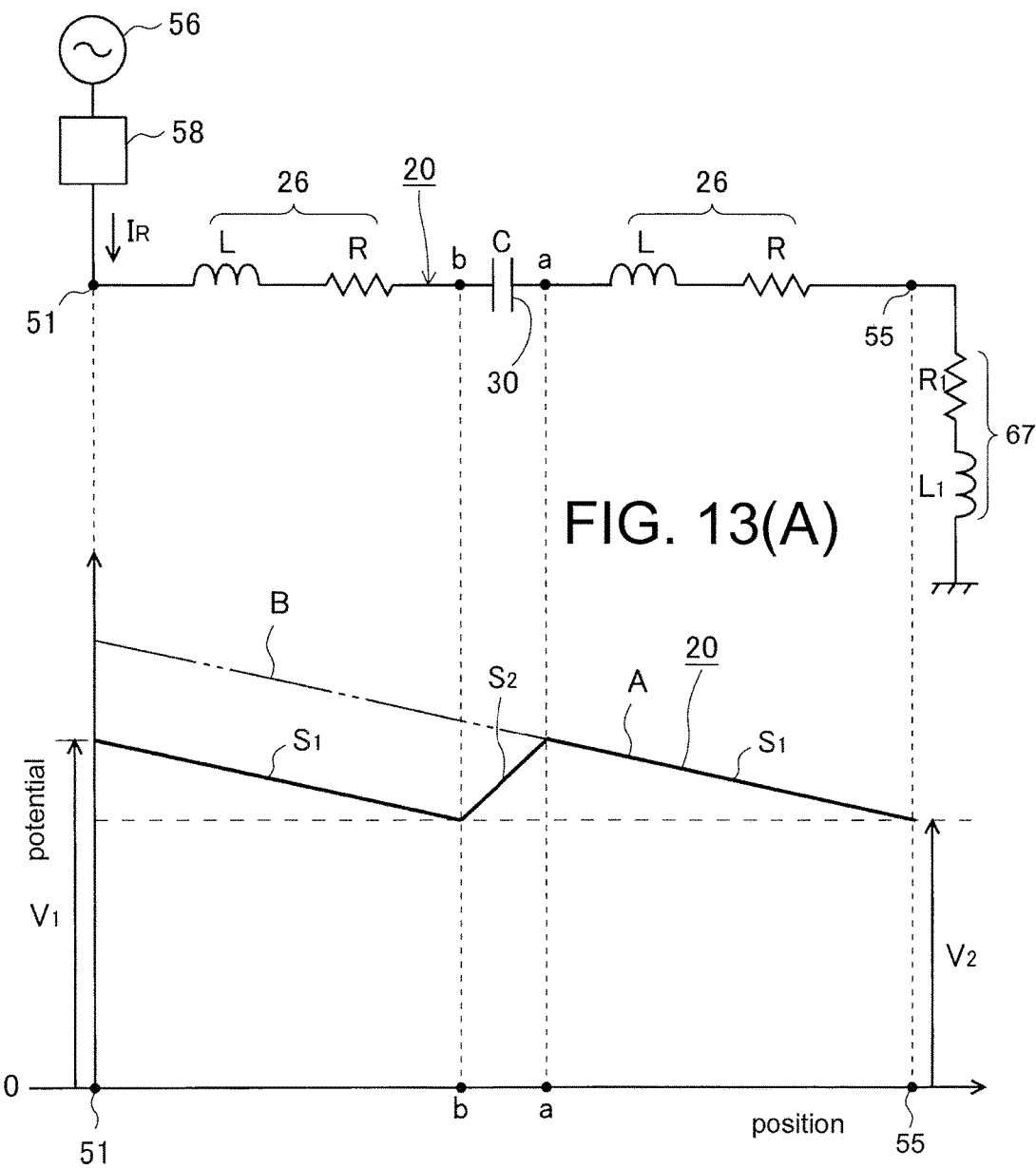
FIG. 13 includes FIG. 13(A) and FIG. 13(B) that show an example of the equivalent circuit and the potential distribution around one antenna.

In detail, an equivalent circuit of the antenna 20 (more specifically, the antenna body 24 thereof) shown in FIG. 12 is shown in FIG. 13(A). Herein, the inductance of each metal pipe 26 is denoted as L, the resistance is denoted as R, and the electrostatic capacity of the condenser 30 is denoted as C. The inductance L and the resistance R of each metal pipe 26 have substantially the same value if each metal pipe 26 has substantially the same length. An impedance $Z_A$ of the antenna 20 can be represented by the following equation, wherein ω represents the angular frequency of the high frequency current $I_R$, and j represents an imaginary unit.

$$Z_A = 2R + j(2\omega L - 1/\omega C) \quad \text{[Equation 4]}$$

The imaginary part in the above equation is the combined reactance of the antenna body 24 and takes the form of subtracting the capacitive reactance $1/\omega C$ from the inductive reactance $2\omega L$. Therefore, by series connection of the condenser 30, the impedance $Z_A$ of the antenna 20 can be reduced. In other words, according to this antenna 20, since the numbers of the metal pipe 26 and the condenser 30 that constitute the antenna body 24 can be suitably selected, the impedance $Z_A$ of the antenna 20 can be set to an appropriate value regardless of the length of the antenna 20.

As a result, even if the antenna 20 is lengthened so as to cope with size increase of the substrate 10, increase of the impedance $Z_A$ can be suppressed. Accordingly, occurrence of a large potential difference between both ends of the antenna 20 can be suppressed. Thereby, the plasma 16 having good uniformity can be generated. In addition, uniformity of processing of the substrate 10 can be improved.

As clear from the above description, the electrostatic capacity C of the condenser 30 is preferably set in advance in a manner that the imaginary part (e.g. the imaginary part in the above equation 4) of the impedance of the antenna body 24, more strictly speaking, the imaginary part at generation of the plasma 16, is as small as possible. The reason for specifying "at generation of the plasma 16" is that, because it is known by experience that the inductance L is reduced when plasma is generated, it is preferred to design the invention in advance in expectation of the reduction. The series resonance conditions are satisfied when the imaginary part becomes 0, which is preferred. However, the series resonance conditions do not necessarily have to be satisfied. In most cases, the inductive reactance is greater, and thus the impedance $Z_A$ of the antenna 20 is generally inductive, which however does not matter.

In a case where the series resonance conditions are satisfied in the circuit in FIG. 13(A) when the high frequency current $I_R$ is applied to the antenna 20, an example of potential distribution of the antenna 20 is shown by the solid line A in FIG. 13(B). In FIG. 13(B), to simplify the description, the resistance R is ignored. The inclined portion $S_1$ indicates a potential rise caused by the inductive reactance ωL, and the inclined portion $S_2$ indicates a potential drop caused by the capacitive reactance $1/\omega C$. A voltage $V_1$ of the power supply end 51 and a voltage $V_2$ of the terminal end 55 of the antenna 20 are described later.

The chain double-dashed line B in FIG. 13(B) indicates the potential distribution when the antenna is a conventional mere conductor without having a component equivalent to the condenser 30.

As clear from FIG. 13(B), in the antenna 20, the potential difference between the two ends 51 and 52 can be suppressed to be small. Accordingly, the plasma 16 having good uniformity can be generated. In addition, uniformity of substrate processing can be improved.

If the series resonance conditions are not satisfied, e.g. the potential at point B in FIG. 13(B) shifts to some extent to the positive side (in the inductive case) or to the negative side (in the capacitive case), accordingly, the potential of the other portions will also shift. Still, compared to the conventional mere conductor shown by the chain double-dashed line B, the potential difference between both ends of the antenna can be suppressed to be small.

In addition, in the plasma processing device, the terminal end 55 of the antenna body 24 is grounded via the coil 67. Thus, due to the voltage $V_2$ generated at both ends of the coil 67, the potential of the entire antenna 20 can be raised. That is, if the high frequency current applied to the antenna 20 is denoted as $I_R$, the resistance of the coil 67 is denoted as $R_1$, and the inductance is denoted as $L_1$, the voltage $V_2$ generated at both ends of the coil 67 is represented by the following equation, and becomes the voltage of the terminal end 55. In proportion to the voltage $V_2$, compared to a case where the terminal end 55 is directly grounded (i.e., grounded without via a coil or a condenser; the same applies hereinafter), the potential of the entire antenna 20 is raised. An example of such situation is shown in FIG. 5(B). $V_1$ indicates the voltage of the power supply end 51.

$$V_2 = (R_1 + j\omega L_1) I_R \quad \text{[Equation 5]}$$

As a result, as described above, in addition to the mode in which the plasma 16 is generated due to the induced electric field generated by application of the high frequency current $I_R$ to the antenna 20, i.e., plasma generation in an inductive coupling mode, a mode in which the plasma 16 is generated due to a high frequency electric field generated between the antenna 20 and an inner wall of the vacuum chamber 2 or the like, i.e., plasma generation in a capacity coupling mode, can be utilized. Therefore, efficiency of plasma generation can be further improved, by which efficiency of substrate processing can be further improved. For example, if film formation is performed on the substrate 10, a film forming speed is increased. If etching is performed on the substrate 10, an etching speed is increased.

As described above, by adoption of the structure in which a plurality of metal pipes 26 are electrically connected in series with the condenser 30, the potential difference between both ends of the antenna 20 can be reduced. However, if the terminal end 55 of the antenna 20 is directly grounded, because the terminal end 55 has a ground potential, the potential of the entire antenna 20 is reduced, and the aforementioned plasma generation in the capacity coupling mode cannot be expected. Accordingly, compared to the case where the terminal end 55 is grounded via the coil 67, efficiency of plasma generation is lower. For example, if film formation is performed on the substrate 10 by a plasma CVD method, the film forming speed is slow (see FIG. 21 and a description thereof which will follow later).

In addition, the terminal end 55 of the antenna 20 may also be grounded via a condenser. However, it is more advantageous to ground the terminal end 55 via the coil 67. This is described hereinafter.

Figure 14:
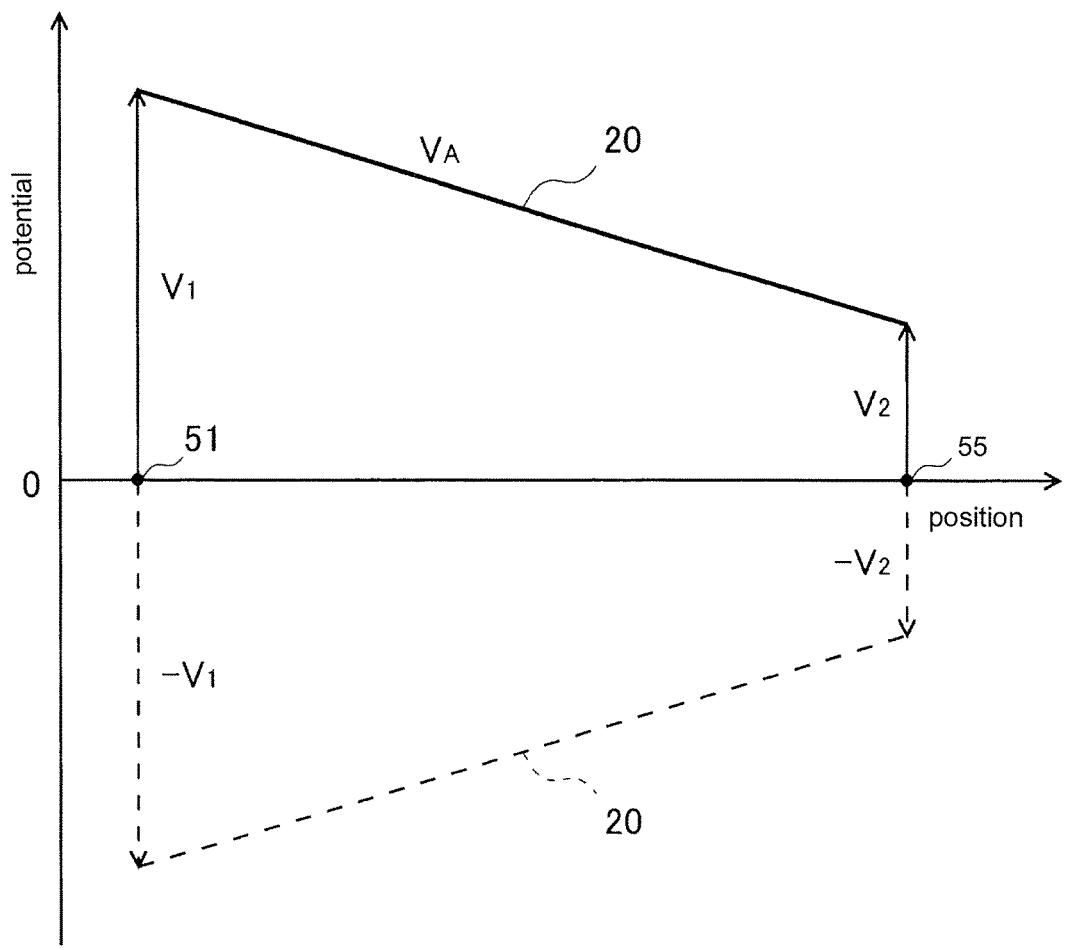
FIG. 14 is a schematic simplified diagram showing an example of the potential distribution of the antenna when the terminal end of the inductive antenna is grounded via the coil.

As described above, the impedance $Z_A$ of the antenna 20 is generally inductive, and the example of potential distribution of the antenna 20 when the antenna 20 is inductive and the terminal end 55 of the antenna 20 is grounded via the coil 67 is shown in FIG. 14 in a simplified manner. Due to series insertion of the condenser 30, the potential of the antenna 20 undulates as shown by, e.g. the solid line A in FIG. 13(B), if viewed closely. Nevertheless, the details are not important here, and thus the potential is simplified and shown by a straight line (the same also applies to FIG. 15). Namely, FIG. 14 is equivalent to that obtained by simplifying the solid line A in FIG. 13(B).

If a voltage between the power supply end 51 and the terminal end 55 of the antenna 20 is set to $V_A$ ($=Z_A \cdot I_R$), since the impedance $Z_A$ of the antenna 20 is inductive, in the case where the terminal end 55 is grounded via the coil 67 having the same inductive reactance, in short, since phases of the voltage $V_A$ of the antenna 20 and the voltage $V_2$ of the terminal end 55 are closer to each other, the potential of the entire antenna 20 is raised by the voltage $V_2$, and as described above, the potential of the entire antenna 20 is considerably increased. Thereby, as described above, in addition to plasma generation in the inductive coupling mode, plasma generation in the capacity coupling mode can be utilized, and efficiency of plasma generation can be improved. Moreover, because it is the high frequency current $I_R$ that is applied to the antenna 20, the voltages of the antenna 20, the power supply end 51 and the terminal end 55 are inverted and oscillate between the state shown by the solid line and the state shown by the dashed line in FIG. 14 at the frequency of the high frequency current $I_R$.

Figure 15:
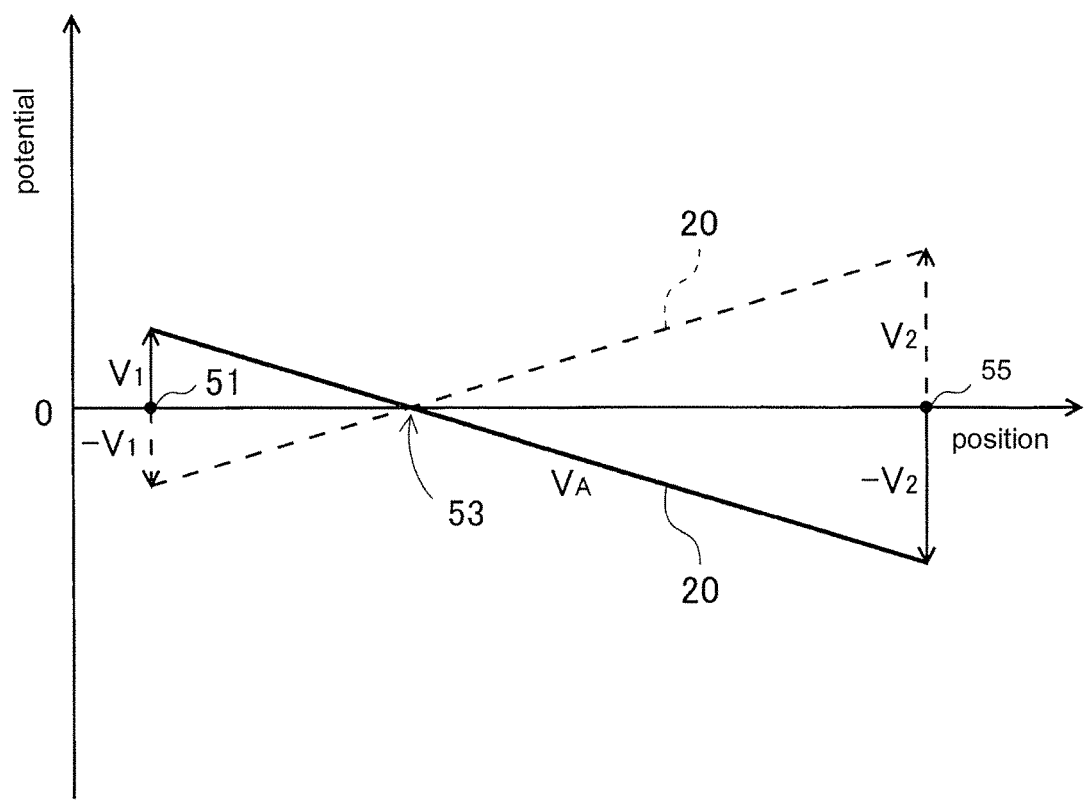
FIG. 15 is a schematic simplified diagram showing an example of the potential distribution of the antenna when the terminal end of the inductive antenna is grounded via the condenser.

On the other hand, if the terminal end 55 of the antenna 20 is grounded via a condenser having a capacitive reactance, in short, from the viewpoint of phase, the voltage of the terminal end 55 becomes $-V_2$, which is opposite that in FIG. 6 in which the terminal end 55 is grounded via the coil 67, and like the example shown in FIG. 15, the potential of the entire antenna 20 is lowered due to the voltage $-V_2$. Thus, the potential of the entire antenna 20 is considerably reduced. In this case, similarly, the voltages of the antenna 20, the power supply end 51 and the terminal end 55 are inverted and oscillate between the state shown by the solid line and the state shown by the dashed line in FIG. 15 at the frequency of the high frequency current $I_R$ applied to the antenna 20.

Accordingly, if the terminal end 55 is grounded via a condenser, since the potential of the entire antenna 20 is considerably reduced, it becomes difficult to utilize the aforementioned plasma generation in the capacity coupling mode. Accordingly, compared to the grounding via the coil 67, efficiency of plasma generation is reduced.

In addition, in the case of condenser grounding, even if the high frequency current $I_R$ is applied, like the example shown in FIG. 15, in the potential distribution of the antenna 20, a node 53 at which the potential almost does not change is generated. If such node 53 is generated, there will be a possibility that the processing state of the substrate 10 in the position corresponding to the node 53 differs from that of the other portions. For example, if a film is formed on the substrate 10, properties of the film in the position corresponding to the node 53 may differ from that of the other portions, which is not preferable. In the case of grounding via the coil 67, occurrence of such inconvenience can be prevented (see FIG. 14).

Furthermore, if it is the coil 67 that is put into the terminal end 55, since the structure is simpler than that of the condenser, member cost and manufacturing cost are low. Moreover, cooling is easy if water passes through the hollow coil. Therefore, in respects of cost and cooling, the coil 67 is more advantageous than the condenser.

As described above, the condenser 30 disposed in a portion of the hollow insulator 28 of the antenna body 24 is preferably a layered condenser as described above. In that way, the distance between the metal pipe 26 and the insulating pipe 22 outside the metal pipe 26 is prevented from increasing, and the resistance to the cooling water 44 flowing inside is prevented from increasing.

In detail, if the aforementioned condenser as an electronic part, instead of the layered condenser 30, is attached to the outside of the hollow insulator 28, in proportion to the condenser, the insulating pipe 22 will have to be thickened. In that way, the following inconveniences may occur: (a) the distance between the metal pipe 26 inside the insulating pipe 22 and the plasma 16 outside the insulating pipe 22 is increased, which becomes a main cause of reduction in generation efficiency of the plasma 16; (b) unwanted plasma may be generated in the thickened insulating pipe 22; and so on. According to the layered condenser 30, occurrence of such inconveniences can be prevented.

In addition, if the aforementioned condenser as an electronic part is attached to the inside of the hollow insulator 28, the following inconveniences may occur: (a) the condenser may hinder the flow of the cooling water 44 so as to reduce cooling performance of the antenna; (b) in order to improve the aforementioned point, if the metal pipe 26 and the hollow insulator 28 are considerably thickened, as described in the problem of Patent Literature 3, the area of the metal pipe 26 is increased so that the potential distribution is easily transferred to the film on the surface of the substrate, and film thickness distribution may become disordered; and so on. According to the layered condenser 30, occurrence of such inconveniences can also be prevented.

Next, other examples of the structure of the antenna 20 and so on are described.

As described above, the number of the metal pipe 26 that constitutes the antenna body 24 of the antenna 20 is set to three or more, and the hollow insulator 28 and the condenser 30 may be respectively disposed between the metal pipes 26. In that way, the potential distribution of the antenna 20 is divided into smaller sections than that shown in FIG. 13, so that the potential difference between both ends of the antenna 20 can be reduced.

If the condenser 30 is layered, as described above, the condenser 30 may include a plurality of layers of the first electrode 32, the second electrode 34 and the dielectric 36. In that way, it becomes easy to increase the electrostatic capacity C of the condenser 30. Thereby, the combined reactance of the antenna body 24 is reduced, making it easier to reduce the impedance $Z_A$ of the antenna 20.

Like the example shown in FIG. 12 and so on, the antenna body 24 that constitutes the antenna 20 is preferably disposed in advance in the insulating pipe 22 with the space 23 therebetween. In that way, due to the presence of the space 23, the potential of the surface of the insulating pipe 22 can be suppressed from rising, and thus the plasma potential can be suppressed from rising.

In detail, as described above, by application of the high frequency current $I_R$, the potential of the antenna body 24 rises (e.g. see FIG. 13). In this case, if the space 23 is present between the antenna body 24 and the insulating pipe 22, since the small electrostatic capacity $C_3$ exist in the space 23 and the relatively large electrostatic capacity $C_4$ exist in the thickness of the insulating pipe 22 are connected in series between the antenna body 24 and the surface of the insulating pipe 22, the series combined electrostatic capacity is small. Accordingly, the surface of the insulating pipe 22 becomes unlikely to be influenced by the rise in potential of the antenna body 24, and thus the potential of the surface of the insulating pipe 22 can be suppressed from rising. Thereby, the potential of the plasma 16 can be suppressed from rising. In contrast, if the antenna body 24 (specifically, the metal pipe 26) touches the inner wall of the insulating pipe 22 without via the space 23, since the electrostatic capacity $C_3$ in the series is no longer present, the surface of the insulating pipe 22 becomes likely to be influenced by the rise in potential of the antenna body 24, so that the potential of the surface of the insulating pipe 22 is increased. The antenna 20 is not limited to the linear shape but may be curved. In that case, the aforementioned effects can also be achieved. For example, the antenna 20 may be curved so as to conform to the planar shape of the substrate 10. In addition, the antenna 20 may also have a shape of being folded back at a middle portion (e.g. a long and thin U shape) or the like.

Next, several embodiments of the plasma processing device having a plurality of linear antennas 20 are described. In the following, mainly the differences from the previous embodiments and the differences between the following embodiments are described with reference to FIG. 12 and so on.

Figure 16:
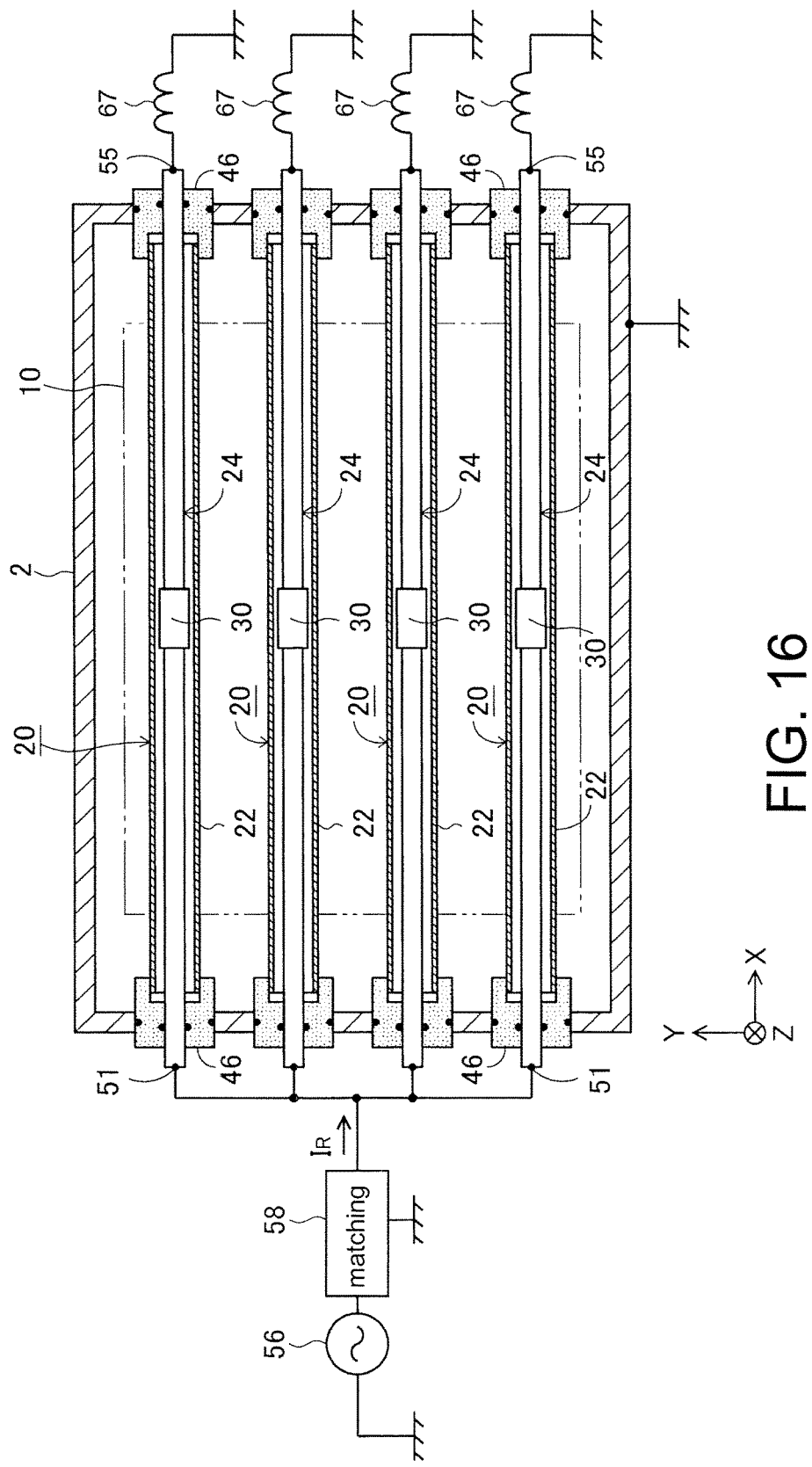
FIG. 16 is a schematic transverse sectional view showing another embodiment of the plasma processing device that includes a plurality of linear antennas.

FIG. 16 is a schematic sectional view showing an embodiment of the plasma processing device having a plurality of linear antennas 20. As in this embodiment, in the vacuum chamber 2, a plurality of linear antennas 20 may be disposed in parallel in a direction along the surface of the substrate 10 (e.g. substantially parallel to the surface of the substrate 10). In that way, plasma having good uniformity can be generated in a wider region, and thus processing of larger substrates can be coped with.

In this embodiment, the power supply ends 51 of the antenna bodies 24 of a plurality of antennas 20 are on the same side (left side in the drawing), and the terminal ends 55 of a plurality of antenna bodies 24 are on the same side (right side in the drawing) opposite the side of the power supply ends 51. The same also applies to the later-described other embodiments. The power supply ends 51 of the antenna bodies 24 of the plurality of antennas 20 are connected to one high frequency power source 56 via one matching circuit 58. However, the matching circuit 58 may also be disposed for each antenna 20. The terminal ends 55 of the antenna bodies 24 of the plurality of antennas 20 may be grounded individually via the coil 67 as in this embodiment, or the plurality of terminal ends 55 may be grounded together via one coil 67. In the latter way, the number of the coil 67 can be reduced.

Moreover, the number of the antennas 20 disposed in parallel is not limited to four as in the illustrated example, but is arbitrarily two or more. The number may be even or odd. The same also applies to the later-described other embodiments.

Figure 17:
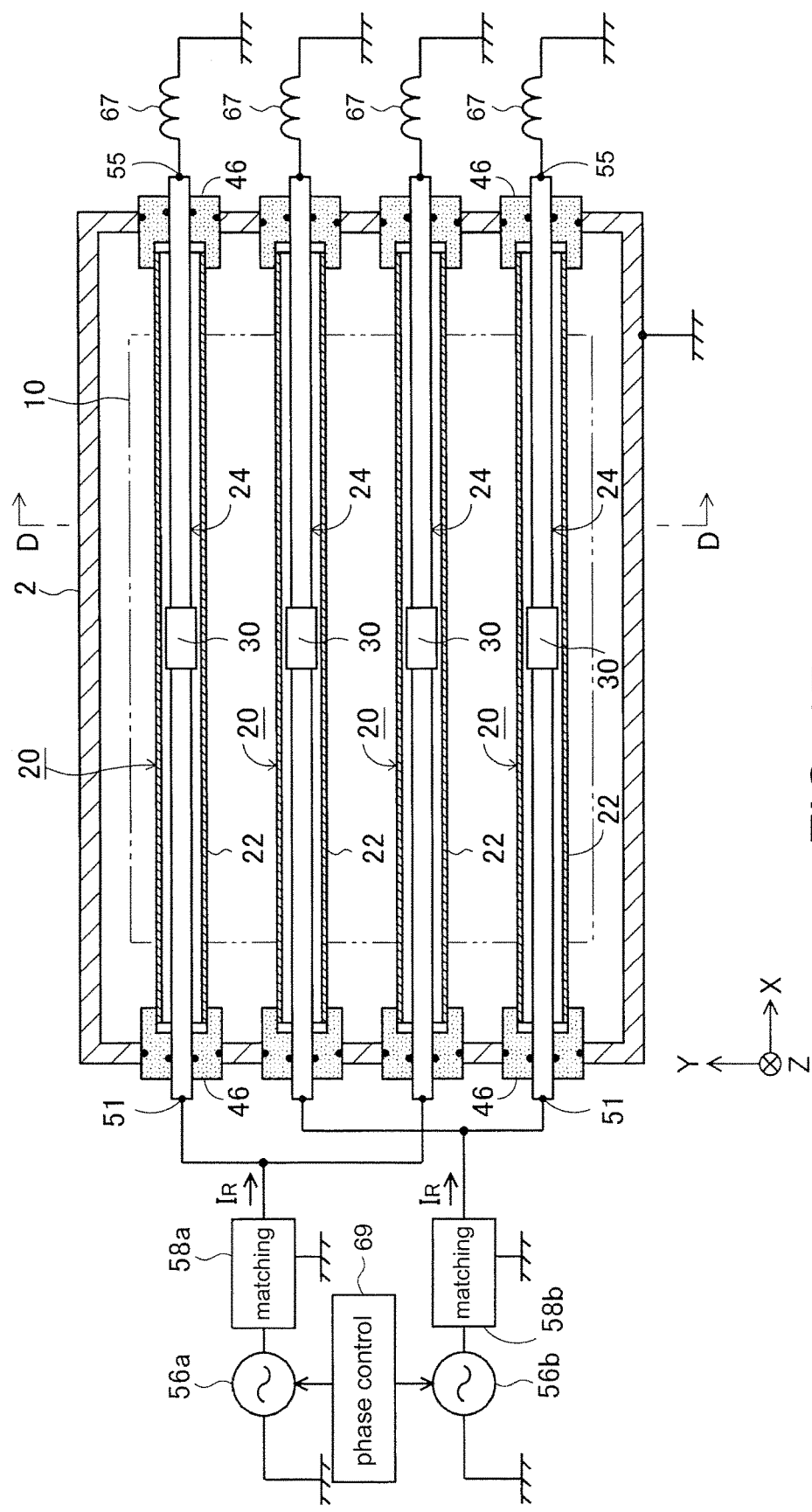
FIG. 17 is a schematic transverse sectional view showing another embodiment of the plasma processing device that includes a plurality of linear antennas.

In brief, the embodiment shown in FIG. 17 differs from the embodiment shown in FIG. 16 in that the high frequency current $I^R$ is supplied to each antenna 20 in a different manner. That is, in this embodiment, a plurality of antennas 20 are divided into first and second groups such that the adjacent antennas 20 belong to different groups (in other words, in an alternate manner), and the power supply ends 51 of the antenna bodies 24 belonging to each group are respectively electrically connected in parallel. Furthermore, in this embodiment, a first high frequency power source 56a that supplies the high frequency current $I_R$ to the antenna bodies 24 (more specifically, the power supply ends 51 thereof, the same applies hereinafter) of the antennas 20 belonging to the first group, a second high frequency power source 56b that supplies the high frequency current $I_R$ to the antenna bodies 24 of the antennas 20 belonging to the second group, and a phase controller 69 that controls a phase difference between the high frequency current $I_R$ outputted from the first high frequency power source 56a and the high frequency current $I_R$ outputted from the second high frequency power source 56b are provided.

In this embodiment, the terminal ends 55 of the antenna bodies 24 of the antennas 20 belonging to the two groups are grounded individually via the coil 67.

According to this embodiment, since a phase difference can be imparted between the high frequency currents $I_R$ applied to the antennas 20 belonging to the two groups, a potential difference can be generated between the adjacent antennas 20. Due to this potential difference, plasma can be generated between the adjacent antennas 20 in the so-called capacity coupling mode. Thus, efficiency of plasma generation can be further improved, and uniformity of plasma density distribution in an alignment direction (Y direction in this embodiment) of the plurality of antennas 20 can be improved.

For example, if the phase difference is set to $\varphi$, a potential difference $\Delta V$ between the adjacent antennas 20 is represented by the following equation. $V_0$ represents amplitude (maximum value), $\omega$ represents the angular frequency of the high frequency current $I_R$, and t represents time. Accordingly, the potential difference ΔV can be effectively used between the adjacent antennas 20.

$$\Delta V = V_0 \sin(\omega t) - V_0 \sin(\omega t + \varphi) \quad \text{[Equation 6]}$$

Figures 19A, 19B:
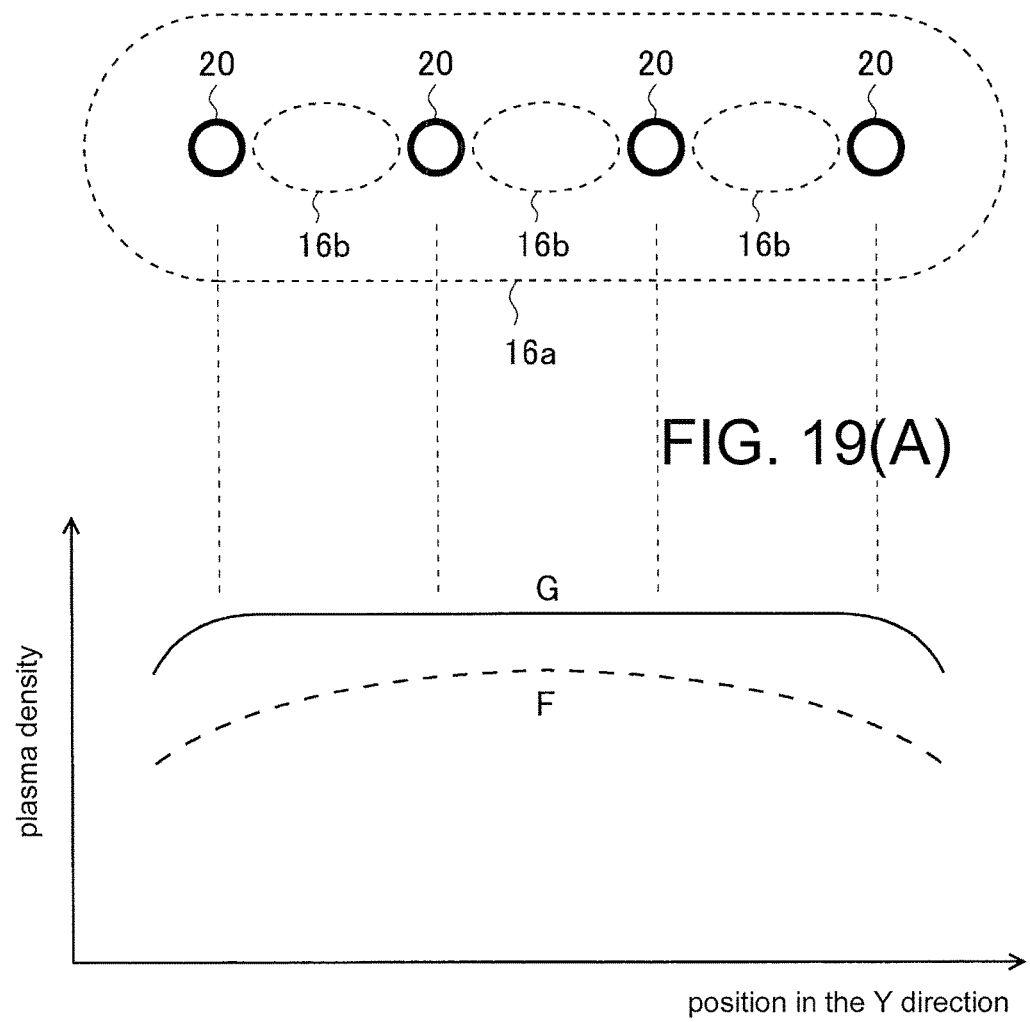
FIG. 19 includes FIG. 19(A) that is a schematic simplified sectional view showing the antenna of FIG. 17 along the line D-D and FIG. 19(B) that is a schematic example of the plasma density distribution in the vicinity of the substrate in such a case.

A description is further given of the improvement in uniformity of plasma density distribution in the alignment direction (Y direction) of the plurality of antennas 20 with reference to FIG. 19. FIG. 19 includes FIG. 19(A) that is a schematic sectional view showing the antenna in FIG. 17 along line D-D in a simplified manner and FIG. 19(B) that shows a schematic example of plasma density distribution in the vicinity of the substrate in the above case.

By application of the high frequency current $I_R$, a high frequency magnetic field is generated around the antenna 20, and thereby plasma 16a is generated in the inductive coupling mode. In this drawing, the plasma 16a shows the plasma generated by a plurality of antennas 20 collectively. The plasma 16a has a wider plasma generation region due to the large expanse of the high frequency magnetic field. As a result, the plasma density is relatively likely to reduce at a peripheral portion in the alignment direction (Y direction) of the plurality of antennas 20. The density distribution of the plasma 16a generated in the inductive coupling mode in the vicinity of the substrate 10 tends to be a mountain-shaped distribution as shown by, e.g. the dashed line F in FIG. 19(B).

On the other hand, if the potential difference ΔV is generated between the adjacent antennas 20 due to the phase difference φ, due to the potential difference ΔV, plasma 16b can be generated in the capacity coupling mode between the adjacent antennas 20. The potential difference ΔV is easily generated in a narrow region between the adjacent antennas 20, and the narrow region between the adjacent antennas 20 becomes a main generation region of the plasma 16b so that the scope of each plasma 16b is reduced.

The aforementioned plasma 16 that reaches the vicinity of the substrate 10 is obtained by combining the plasma 16a with the plasma 16b. Therefore, in the plasma density distribution in the vicinity of the substrate 10, e.g. as shown by the solid line G in FIG. 19(B), reduction in the density at the peripheral portion in the alignment direction (Y direction) of the plurality of antennas 20 becomes less, and uniformity is improved.

The phase controller 69 preferably controls the phase difference φ to be substantially 180 degrees (i.e., 180 degrees or approximately 180 degrees). If the phase difference φ is 180 degrees, the potential difference ΔV is represented by the following equation. Namely, the potential difference ΔV twice that in the case of a single antenna can be obtained.

$$\Delta V = 2V_0 \sin(\omega t) \quad \text{[Equation 7]}$$

In this way, by setting the phase difference φ to substantially 180 degrees, the potential difference ΔV between the adjacent antennas 20 can be maximized. Thus, plasma can be efficiently generated in the capacity coupling mode between the adjacent antennas 20. As a result, efficiency of plasma generation can be further improved, and it becomes easier to improve uniformity of plasma density distribution in the alignment direction of the plurality of antennas 20.

Figure 18:
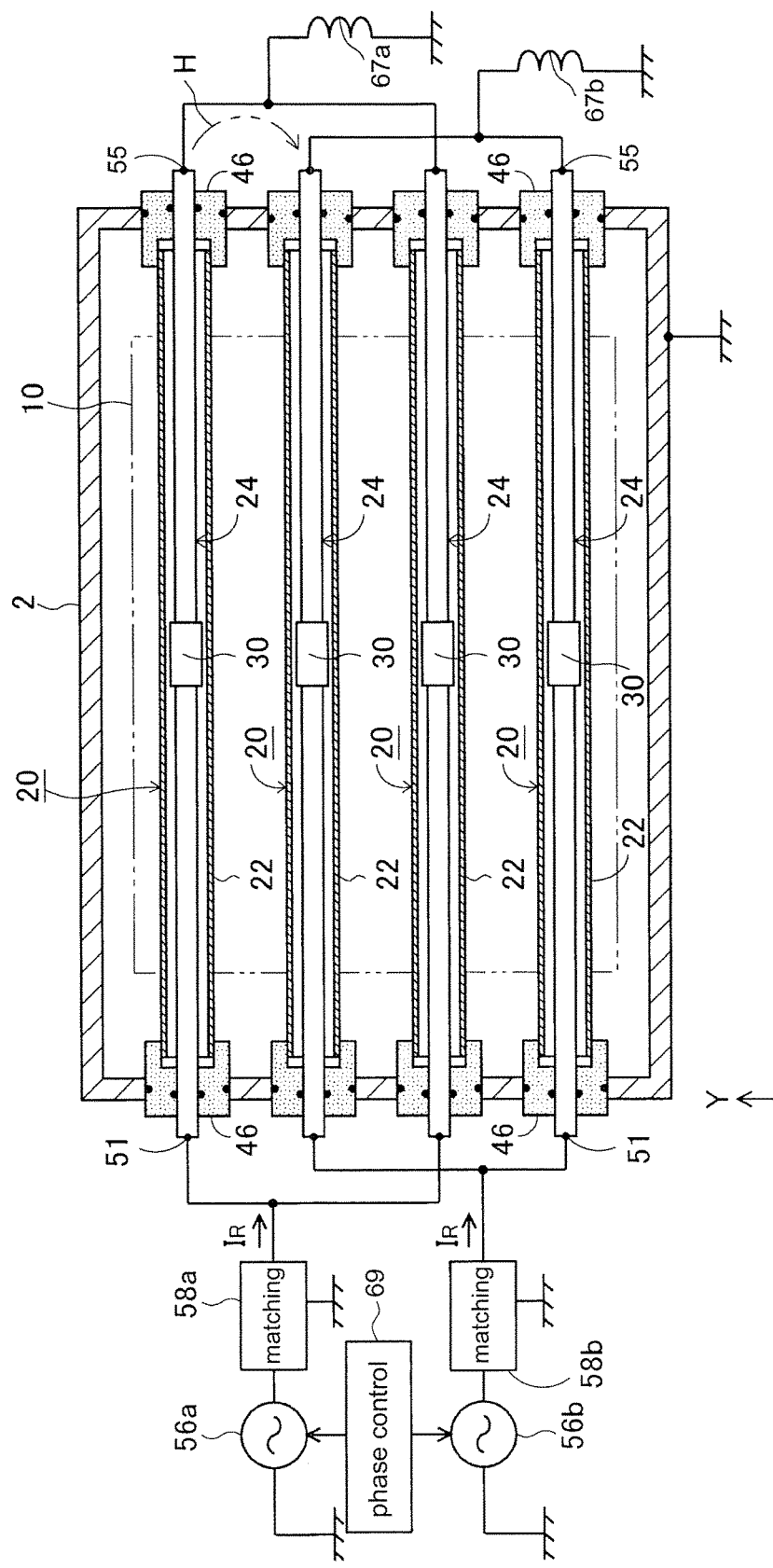
FIG. 18 is a schematic transverse sectional view showing another embodiment of the plasma processing device that includes a plurality of linear antennas.

As in the embodiment shown in FIG. 18 as a variant of the side of the coil 67 in the embodiment shown in FIG. 17, the terminal ends 55 of the antenna bodies 24 of the antennas 20 belonging to the first group may be grounded together via a first coil 67a, and the terminal ends 55 of the antenna bodies 24 of the antennas 20 belonging to the second group may be grounded together via a second coil 67b.

In that way, compared to the embodiment in FIG. 17, the number of the coil 67 can be reduced. That is, the number is half or approximately half.

Moreover, if a plurality of antennas 20 are divided into two groups to supply high frequency power as described above, it is unfavorable that the terminal ends 55 of the antennas 20 of the two groups are grounded together via one coil. The reason is that, if the terminal ends 55 are grounded together in that way, inconveniences occur such as that the high frequency power, goes from the terminal ends 55 of the antennas 20 belonging to one group through the terminal ends 55 of the antennas 20 belonging to the other group, would returns to the high frequency power source 56a or 56b on the other side to cause interference occur.

In contrast, as in the embodiment shown in FIG. 18, if the coils 67a and 67b are disposed, one for each group of the antennas 20, occurrence of inconveniences such as that the high frequency power, goes from the terminal ends 55 of the antennas 20 belonging to one group through the terminal ends 55 of the antennas 20 belonging to the other group, would returns to the high frequency power source 56a or 56b on the other side (e.g: a high frequency current flows through a route shown by the chain double-dashed line H in FIG. 18) to cause interference can be prevented.

Next, several experiment results are described.

Figure 20:
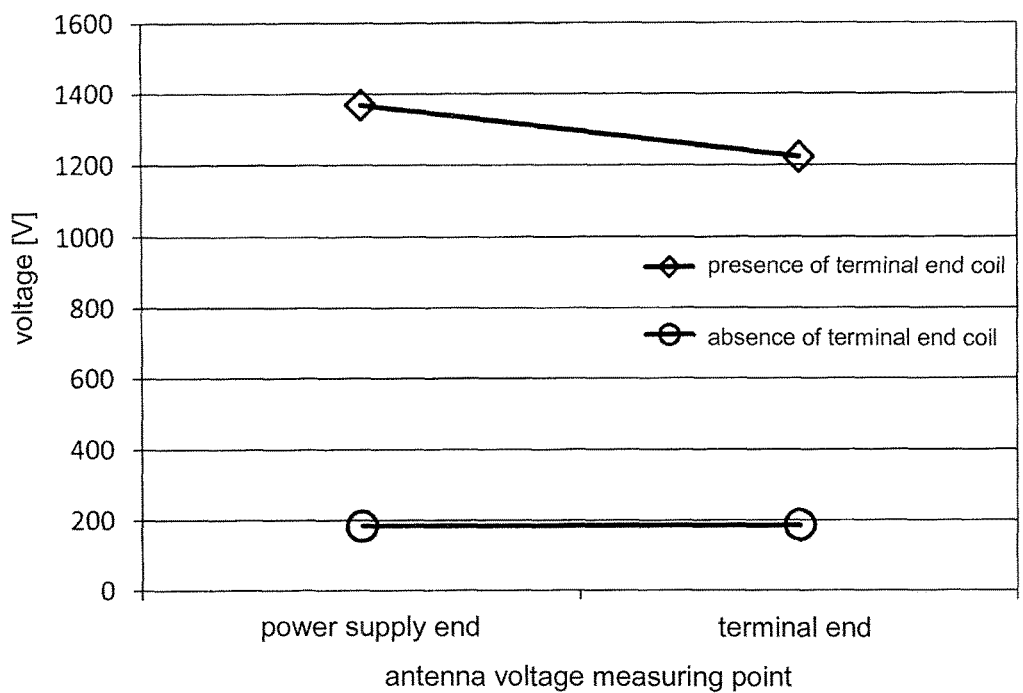
FIG. 20 is a diagram showing an example of the experiment results obtained by measuring the voltages of the ends of the antenna in the presence or absence of the terminal end coil.

FIG. 20 shows an example of an experiment result obtained by measuring the voltages of the ends (the power supply end 51 and the terminal end 55) of the antenna 20 in the presence or absence of the terminal end coil 67. "In the presence of the terminal end coil 67" means that the terminal end 55 of the antenna 20 is grounded via the coil 67; "in the absence of the terminal end coil 67" means that the terminal end 55 is directly grounded without via the coil 67 (the same applies hereinafter).

The main experiment conditions in this case are as follows.

Device configuration: the one in the embodiment shown in FIG. 9; there are six antennas 20, each having three condensers 30 (and accordingly, four metal pipes 26);
Material of the insulating pipe 22: quartz;
Phase difference between the two high frequency power source 56a and 56b: 180 degrees;
High frequency power supplied to each antenna 20: 500 W per antenna;
Gas supply into the vacuum chamber 2 and plasma lighting: none;
Inductance of each coil 67: 180 nH.

As clear from this drawing, compared to the case in the absence of the terminal end coil 67, in the presence of the terminal end coil 67, the voltages (potentials) of not only the power supply end 51 and the terminal end 55 but also the entire antenna 20 are considerably raised. Accordingly, in addition to the aforementioned plasma generation in the inductive coupling mode, the aforementioned plasma generation in the capacity coupling mode can be effectively utilized.

Figure 21:
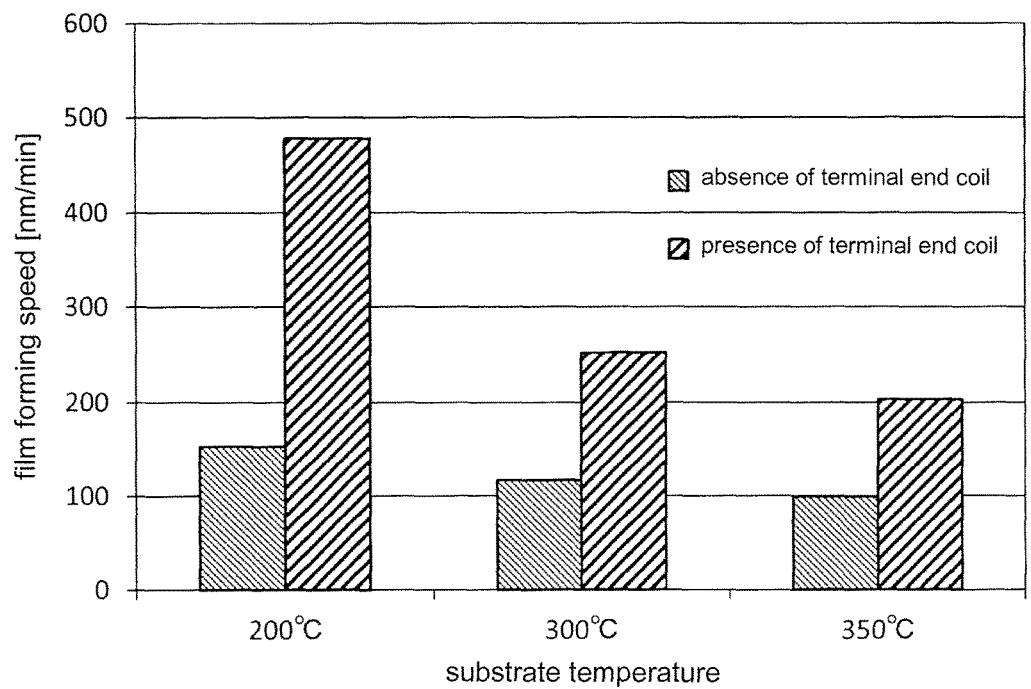
FIG. 21 is a diagram showing an example of the experiment results obtained by measuring the film forming speed on the substrate by plasma CVD in the presence or absence of the terminal end coil.

FIG. 21 shows an example of an experiment result obtained by measuring the film forming speed on the substrate 10 by a plasma CVD method in the presence or absence of the terminal end coil 67. The film formed on the substrate 10 is a SiN:F film (fluorinated silicon nitride film).

The main experiment conditions in this case are as follows.

Device configuration: the one in the embodiment shown in FIG. 9; there are six antennas 20, each having three condensers 30 (and accordingly, four metal pipes 26);
Material of the insulating pipe 22: quartz;
Phase difference between the two high frequency power source 56a and 56b: 180 degrees;
High frequency power supplied to each antenna 20: 1.5 kW per antenna;
Type and flow rate of gas into the vacuum chamber 2: $SiF_4/N_2/H_2$=500/500/500 ccm;
Pressure in the vacuum chamber 2: 2.7 PA;
Inductance of each coil 67: 180 nH.

As clear from this drawing, compared to the case in the absence of the terminal end coil 67, in the presence of the terminal end coil 67, a high film forming speed is achieved at any substrate temperature. This is because that in addition to the aforementioned plasma generation in the inductive coupling mode, the aforementioned plasma generation in the capacity coupling mode can be effectively utilized.

According to the antenna of a technical solution of the invention, at least the following effect is achieved.

(a) Since the antenna is an internal antenna disposed in the vacuum chamber, it has higher efficiency of plasma generation than an external antenna.

(b) An antenna body that constitutes the antenna has a structure in which a plurality of metal pipes are connected in series with a hollow insulator interposed between the adjacent metal pipes. Moreover, the antenna body includes a condenser electrically connected in series to the metal pipes on two sides of the hollow insulator. Thus, in brief, a combined reactance of the antenna body takes the form of subtracting a capacitive reactance from an inductive reactance. Thereby, an impedance of the antenna can be reduced. As a result, even if the antenna is lengthened, increase of the impedance can be suppressed. Accordingly, occurrence of a large potential difference between both ends of the antenna can be suppressed. Thereby, plasma having good uniformity can be generated.

(c) Since increase of the impedance can be suppressed even if the antenna is lengthened, application of a high frequency current to the antenna becomes easier and an inductively coupled plasma can be efficiently generated.

(d) The condenser includes a portion of the metal pipe on the side of a first connecting portion as a first electrode of the condenser, a dielectric on an outer peripheral portion of the first electrode, and a second electrode on an outer peripheral portion of the dielectric. Thus, a distance between the metal pipe and an insulating pipe outside the metal pipe is prevented from increasing, and a resistance to cooling water flowing inside is prevented from increasing.

(e) The condenser includes a portion of the metal pipe on the side of a first connecting portion as the first electrode of the condenser, and the dielectric disposed in a region from an outer peripheral portion of the metal pipe to an outer peripheral portion of the hollow insulator. Moreover, the cooling water flows through the metal pipe. Thus, due to high thermal conductivity of the metal pipe, the dielectric can be efficiently cooled. As a result, damage to the dielectric caused by temperature rise associated with application of the high frequency power is suppressed, and heat resistance of the condenser can be improved.

(f) Since the condenser includes a portion of the metal pipe on the side of the first connecting portion as the first electrode of the condenser, the first electrode may not be disposed separately, and accordingly, structure simplification and decrease in number of members can be realized.

According to the antenna of another technical solution of the invention, the following effect is further achieved. That is, since electrostatic capacity of the condenser is definitely determined by the dielectric and a metal film formed on both sides of the dielectric, high precision is no longer required for machining and installation of the portion of the metal pipe and the second electrode that constitute the condenser. As a result, manufacturing of the condenser portion becomes easy.

According to the antenna of another technical solution of the invention, the following effect is further achieved. That is, since the electrostatic capacity of the condenser is definitely determined by a dielectric sheet and a metal film formed on both sides of the dielectric sheet, high precision is no longer required for machining and installation of the portion of the metal pipe and the second electrode that constitute the condenser. As a result, manufacturing of the condenser portion becomes easy.

In addition, since ends of the dielectric sheet in the circumferential direction overlap each other, a withstand voltage between the metal pipe and the second electrode can be further increased.

Furthermore, since a metal sheet that constitutes the second electrode is wound so as to press down the dielectric sheet including the metal film, heat resistance between the dielectric sheet and the metal pipe is reduced so that a cooling effect of the dielectric sheet can be further improved.

According to the antenna of another technical solution of the invention, the following effect is further achieved. That is, since the electrostatic capacity of the condenser is definitely determined by the dielectric sheet and the metal film formed on both sides of the dielectric sheet, high precision is no longer required for machining and installation of the portion of the metal pipe and the second electrode that constitute the condenser. As a result, manufacturing of the condenser portion becomes easy.

In addition, since the ends of the dielectric sheet in the circumferential direction overlap each other, the withstand voltage between the metal pipe and the second electrode can be further increased.

Furthermore, since the dielectric sheet including the metal film is pressed down by a pair of semi-cylindrical electrodes that constitutes the second electrode, the heat resistance between the dielectric sheet and the metal pipe is reduced so that the cooling effect of the dielectric sheet can be further improved.

According to the antenna of another technical solution of the invention, the following effect is further achieved.

The antenna body that constitutes the antenna has a structure in which a plurality of metal pipes are electrically connected in series with a layered condenser disposed on the outer peripheral portion of the hollow insulator. In brief, the combined reactance of the antenna body takes the form of subtracting the capacitive reactance from the inductive reactance, and thus the impedance of the antenna can be reduced. As a result, even if the antenna is lengthened, increase of the impedance can be suppressed. Accordingly, occurrence of a large potential difference between both ends of the antenna can be suppressed. Thereby, plasma having good uniformity can be generated.

In addition, since increase of the impedance can be suppressed even if the antenna is lengthened, application of the high frequency current to the antenna becomes easier and the inductively coupled plasma can be efficiently generated.

Furthermore, since the antenna body includes the layered condenser disposed on the outer peripheral portion of the hollow insulator, the distance between the metal pipe and the insulating pipe outside the metal pipe is prevented from increasing, and the resistance to the cooling water flowing inside is prevented from increasing.

According to the antenna of another technical solution of the invention, the following effect is further achieved. That is, since each condenser includes a plurality of layers of the first electrode, the second electrode and the dielectric, it becomes easy to increase the electrostatic capacity of each condenser. Thereby, the combined reactance of the antenna body is reduced, making it easier to reduce the impedance of the antenna.

According to the antenna of another technical solution of the invention, the following effect is further achieved. That is, since the antenna body is disposed in the insulating pipe with a space therebetween, due to the presence of the space, the potential of the surface of the insulating pipe can be suppressed from rising, and thus the plasma potential can be suppressed from rising.

According to the plasma processing device of a technical solution of the invention, at least the following effect is achieved.

Since the antenna is an internal antenna disposed in the vacuum chamber, it has higher efficiency of plasma generation than an external antenna.

Moreover, the antenna body that constitutes the antenna has a structure in which a plurality of metal pipes are electrically connected in series with a condenser disposed in a portion of the hollow insulator. In brief, the combined reactance of the antenna body takes the form of subtracting the capacitive reactance from the inductive reactance, and thus the impedance of the antenna can be reduced. As a result, even if the antenna is lengthened, increase of the impedance can be suppressed. Accordingly, occurrence of a large potential difference between both ends of the antenna can be suppressed. Thereby, plasma having good uniformity can be generated.

In addition, since increase of the impedance can be suppressed even if the antenna is lengthened, application of the high frequency current to the antenna becomes easier and the inductively coupled plasma can be efficiently generated. In addition, efficiency of substrate processing can be improved.

Furthermore, since the terminal end of the antenna body is grounded via a coil, due to a voltage generated at both ends of the coil, the potential of the entire antenna can be raised. As a result, in addition to the mode in which plasma is generated due to an induced electric field generated by application of the high frequency current to the antenna, i.e., plasma generation in the inductive coupling mode, the mode in which plasma is generated due to a high frequency electric field generated between the antenna and an inner wall of the vacuum chamber or the like, i.e., plasma generation in the capacity coupling mode, can be utilized. Therefore, efficiency of plasma generation can be further improved, by which efficiency of substrate processing can be further improved.

According to the plasma processing device of another technical solution of the invention, the following effect is further achieved. That is, since the antenna body includes the layered condenser disposed on the outer peripheral portion of the hollow insulator, the distance between the metal pipe and the insulating pipe outside the metal pipe is prevented from increasing, and the resistance to the cooling water flowing inside is prevented from increasing.

According to the plasma processing device of another technical solution of the invention, the following effect is further achieved. That is, since a plurality of linear antennas are disposed in parallel in a direction along a surface of the substrate, plasma having good uniformity can be generated in a wider region, and thus processing of larger substrates can be coped with.

According to the plasma processing device of another technical solution of the invention, the following effect is further achieved. That is, since the terminal ends of the antenna bodies of a plurality of antennas are grounded together via the coil, the number of the coil can be reduced.

According to the plasma processing device of another technical solution of the invention, the following effect is further achieved. That is, since a plurality of linear antennas are disposed in parallel in the direction along the surface of the substrate, plasma having good uniformity can be generated in a wider region, and thus processing of larger substrates can be coped with.

Moreover, the plurality of antennas are divided into first and second groups such that the adjacent antennas belong to different groups. Also, a phase controller that controls a phase difference between the high frequency current outputted from a first high frequency power source that supplies the high frequency current to the antennas belonging to the first group and the high frequency current outputted from a second high frequency power source that supplies the high frequency current to the antennas belonging to the second group is provided. Since the phase difference can be imparted between the high frequency currents applied to the antennas belonging to the two groups, a potential difference can be generated between the adjacent antennas. Due to this potential difference, plasma can be generated between the adjacent antennas in the so-called capacity coupling mode. Thus, efficiency of plasma generation can be further improved, and uniformity of plasma density distribution in an alignment direction of the plurality of antennas can be improved.

According to the plasma processing device of another technical solution of the invention, the following effect is further achieved. That is, since the terminal ends of the antenna bodies of the antennas belonging to the first group are grounded together via a first coil, and the terminal ends of the antenna bodies of the antennas belonging to the second group are grounded together via a second coil, the number of the coil can be reduced. Furthermore, if the coil is disposed for each group of antennas as described above, occurrence of inconveniences such as that high frequency power from the terminal ends of the antennas belonging to one group goes through the terminal ends of the antennas belonging to the other group and returns to a high frequency power source on the other side to cause interference can be prevented.

According to the plasma processing device of another technical solution of the invention, the following effect is further achieved. That is, by setting the phase difference between the high frequency currents outputted from the two high frequency power sources to substantially 180 degrees, the potential difference between the adjacent antennas can be maximized. Thus, plasma can be efficiently generated in the capacity coupling mode between the adjacent antennas. As a result, efficiency of plasma generation can be further improved, and it becomes easier to improve uniformity of plasma density distribution in the alignment direction of the plurality of antennas.

What is claimed is:

1. An antenna disposed in a vacuum chamber for generating an inductively coupled plasma in the vacuum chamber by applying a high frequency current, the antenna comprising:
    an insulating pipe; and
    a hollow antenna body which is disposed in the insulating pipe and in which cooling water flows,
    wherein the antenna body comprises a plurality of metal pipes are connected in series with a hollow insulator interposed between the adjacent metal pipes, and each connecting portion of the metal pipes and the hollow insulator has a waterproof and air-proof seal,
    the hollow antenna body further comprises a condenser disposed on an outer peripheral portion of each hollow insulator.

2. The antenna according to claim 1, wherein:
    the condenser is electrically connected in series to the metal pipes on two sides of the hollow insulator,
    the hollow insulator and the condenser are disposed in the vacuum chamber, and
    wherein the connecting portion that connects one end of the hollow insulator with the metal pipe is a first connecting portion, and the connecting portion that connects the other end with the metal pipe is a second connecting portion,
    wherein a portion of the metal pipe on the side of the first connecting portion also serves as a first electrode of the condenser, and the condenser comprises a dielectric disposed in a region from an outer peripheral portion of the metal pipe on the side of the first connecting portion to an outer peripheral portion of the hollow insulator and a second electrode disposed in a region from an outer peripheral portion of the dielectric to an outer peripheral portion of the metal pipe on the side of the second connecting portion and electrically connected to the metal pipe on the side of the second connecting portion, wherein the second electrode comprises a region that overlaps the metal pipe on the side of the first connecting portion with the dielectric interposed therebetween.

3. The antenna according to claim 2, wherein:
    metal films that are electrically insulated from each other are formed on an inner surface and an outer surface of the dielectric to face each other, wherein the metal film on the inner surface is electrically connected to the metal pipe on the side of the first connecting portion and the metal film on the outer surface is electrically connected to the second electrode.

4. The antenna according to claim 2, wherein:
    the dielectric comprises a dielectric sheet, and metal films that are electrically insulated from each other are formed on two main surfaces of the dielectric sheet to face each other,
    the dielectric sheet is wound once, except for ends of the dielectric sheet in a circumferential direction, in the region from the outer peripheral portion of the metal pipe on the side of the first connecting portion to the outer peripheral portion of the hollow insulator, and the ends of the dielectric sheet in the circumferential direction overlap each other, and
    the second electrode comprises a metal sheet and is wound to press down the dielectric sheet in the region from the outer peripheral portion of the dielectric sheet to the outer peripheral portion of the metal pipe on the side of the second connecting portion, such that the metal film on one main surface of the dielectric sheet is electrically connected to the metal pipe on the side of the first connecting portion, and the metal film on the other main surface is electrically connected to the second electrode.

5. The antenna according to claim 2, wherein:
    the dielectric comprises a dielectric sheet, and metal films that are electrically insulated from each other are formed on two main surfaces of the dielectric sheet to face each other,
    the dielectric sheet is wound once, except for ends of the dielectric sheet in a circumferential direction, in the region from the outer peripheral portion of the metal pipe on the side of the first connecting portion to the outer peripheral portion of the hollow insulator, and the ends of the dielectric sheet in the circumferential direction overlap each other, and
    the second electrode comprises a pair of semi-cylindrical electrodes and presses the dielectric sheet from opposite sides by the two semi-cylindrical electrodes and fixes the two semi-cylindrical electrodes to the metal pipe on the side of the second connecting portion by a fixing means, such that the metal film on one main surface of the dielectric sheet is electrically connected to the metal pipe on the side of the first connecting portion, and the metal film on the other main surface is electrically connected to the second electrode.

6. The antenna according to claim 1, wherein:
    the condenser is a layered condenser and has a structure that the metal pipes on two sides of each hollow insulator and the condenser are electrically connected in series, and
    each condenser comprises a first electrode disposed on the outer peripheral portion of the hollow insulator, and electrically connected to the metal pipe that is connected to one side of the hollow insulator; a second electrode disposed on the outer peripheral portion of the hollow insulator to overlap the first electrode and electrically connected to the metal pipe that is connected to the other side of the hollow insulator; and a dielectric disposed between the first electrode and the second electrode.

7. The antenna according to claim 6, wherein:
    each condenser comprises a plurality of layers of the first electrode, the second electrode, and the dielectric.

8. The antenna according to claim 6, wherein:
    the antenna body is disposed in the insulating pipe with a space therebetween.

9. A plasma processing device generating an induced electric field in a vacuum chamber by applying a high frequency current to an antenna disposed in the vacuum chamber to generate an inductively coupled plasma and processing a substrate with the plasma,
    wherein the antenna comprises an insulating pipe and a hollow antenna body which is disposed in the insulating pipe and in which cooling water flows, and
    the antenna body comprises a plurality of metal pipes are connected in series with a hollow insulator interposed between the adjacent metal pipes, and each connecting portion of the metal pipes and the hollow insulator has a waterproof and air-proof seal,
    the hollow antenna body further comprises a condenser disposed on an outer peripheral portion of each hollow insulator.

10. The plasma processing device according to claim 9, wherein:
the condenser is disposed in a portion of the hollow insulator, and has a structure that the metal pipes on two sides of the hollow insulator and the condenser are electrically connected in series,
the hollow insulator and the condenser are disposed in the vacuum chamber,
the plasma processing device further comprises a high frequency power source connected to a power supply end, which is one end of the antenna body, and supplying the high frequency current to the antenna body, and
a terminal end, which is the other end of the antenna body, is grounded via coil.

11. The plasma processing device according to claim 10, wherein:
the condenser is a layered condenser and comprises a first electrode disposed on the outer peripheral portion of the hollow insulator and electrically connected to the metal pipe that is connected to one side of the hollow insulator; a second electrode disposed on the outer peripheral portion of the hollow insulator to overlap the first electrode, and electrically connected to the metal pipe that is connected to the other side of the hollow insulator, and a dielectric disposed between the first electrode and the second electrode.

12. The plasma processing device according to claim 10, wherein:
the antenna is a linear antenna, and a plurality of the antennas are disposed in parallel in a direction along a surface of the substrate,
the power supply ends of the antenna bodies of the plurality of antennas are connected to one high frequency power source, and
the terminal ends of the antenna bodies of the plurality of antennas are grounded individually via the coil.

13. The plasma processing device according to claim 10, wherein:
the antenna is a linear antenna, and a plurality of the antennas are disposed in parallel in a direction along a surface of the substrate,
the power supply ends of the antenna bodies of the plurality of antennas are connected to one high frequency power source, and
the terminal ends of the antenna bodies of the plurality of antennas are grounded together via the coil.

14. The plasma processing device according to claim 10, wherein:
the antenna is a linear antenna, and a plurality of the antennas are disposed in parallel in a direction along a surface of the substrate,
the plurality of antennas are divided into first and second groups such that the adjacent antennas belong to different groups, and
the plasma processing device comprises:
a first high frequency power source supplying a high frequency current to the antenna bodies of the antennas belonging to the first group;
a second high frequency power source supplying a high frequency current to the antenna bodies of the antennas belonging to the second group; and
a phase controller controlling a phase difference between the high frequency current outputted from the first high frequency power source and the high frequency current outputted from the second high frequency power source,
wherein the terminal ends of the antenna bodies of the antennas belonging to the first and second groups are grounded individually via the coil.

15. The plasma processing device according to claim 14, wherein:
the phase controller controls the phase difference between the high frequency current outputted from the first high frequency power source and the high frequency current outputted from the second high frequency power source to be 180 degrees.

16. The plasma processing device according to claim 10, wherein:
the antenna is a linear antenna, and a plurality of the antennas are disposed in parallel in a direction along a surface of the substrate,
the plurality of antennas are divided into first and second groups such that the adjacent antennas belong to different groups, and
the plasma processing device comprises:
a first high frequency power source supplying a high frequency current to the antenna bodies of the antennas belonging to the first group;
a second high frequency power source supplying a high frequency current to the antenna bodies of the antennas belonging to the second group; and
a phase controller controlling a phase difference between the high frequency current outputted from the first high frequency power source and the high frequency current outputted from the second high frequency power source,
wherein the terminal ends of the antenna bodies of the antennas belonging to the first group are grounded together via a first coil, and
the terminal ends of the antenna bodies of the antennas belonging to the second group are grounded together via a second coil.

17. The plasma processing device according to claim 16, wherein:
the phase controller controls the phase difference between the high frequency current outputted from the first high frequency power source and the high frequency current outputted from the second high frequency power source to be 180 degrees.

18. An antenna for generating a plasma by applying a high frequency current, the antenna comprising:
a hollow antenna body in which cooling water flows,
wherein the antenna body comprises a plurality of metal pipes are connected in series with a hollow insulator interposed between the adjacent metal pipes, and
the hollow antenna body further comprises a condenser disposed on an outer peripheral portion of each hollow insulator.

19. The antenna according to claim 18, wherein:
a connecting portion of the hollow insulator and the adjacent metal pipes is configured such that an end of the hollow insulator extends into the adjacent metal pipes.

* * * * *